(12) United States Patent
Koyama

(10) Patent No.: US 9,083,335 B2
(45) Date of Patent: Jul. 14, 2015

(54) SEMICONDUCTOR DEVICE WITH SWITCH AND LOGIC CIRCUIT

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 241 days.

(21) Appl. No.: 13/572,951

(22) Filed: Aug. 13, 2012

(65) Prior Publication Data

US 2013/0049806 A1 Feb. 28, 2013

(30) Foreign Application Priority Data

Aug. 24, 2011 (JP) ................. 2011-182274

(51) Int. Cl.
*H03K 19/0175* (2006.01)
*H03K 19/094* (2006.01)
*H03K 19/0944* (2006.01)
*H03K 19/017* (2006.01)

(52) U.S. Cl.
CPC .... *H03K 19/09441* (2013.01); *H03K 19/01714* (2013.01)

(58) Field of Classification Search
None
See application file for complete search history.

(56) References Cited

U.S. PATENT DOCUMENTS

| | | | |
|---|---|---|---|
| 5,220,530 A | 6/1993 | Itoh | |
| 5,640,122 A | 6/1997 | McClure | |
| 5,694,061 A * | 12/1997 | Morosawa et al. | ........... 326/119 |
| 5,731,856 A | 3/1998 | Kim et al. | |
| 5,744,864 A | 4/1998 | Cillessen et al. | |
| 6,046,621 A | 4/2000 | Crowley | |
| 6,169,286 B1 | 1/2001 | Singh | |
| 6,268,755 B1 | 7/2001 | Summerlin et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,864,508 B2 | 3/2005 | Yamazaki et al. | |
| 6,952,023 B2 | 10/2005 | Yamazaki et al. | |
| 6,975,142 B2 | 12/2005 | Azami et al. | |
| 7,030,678 B1 | 4/2006 | Burinskiy et al. | |
| 7,049,190 B2 | 5/2006 | Takeda et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Jany Richardson
(74) *Attorney, Agent, or Firm* — Fish & Richardson P.C.

(57) ABSTRACT

A semiconductor device is provided, which includes a switch having a first transistor and a logic circuit having an output terminal. The logic circuit includes a bootstrap circuit having at least one second transistor. The bootstrap circuit is electrically connected to the output terminal. The first transistor and the second transistor have the same conductivity type. Each of the first transistor and the second transistor includes an oxide semiconductor layer including a channel formation region and a pair of gate electrodes with the oxide semiconductor layer provided therebetween.

18 Claims, 10 Drawing Sheets

(56) References Cited

U.S. PATENT DOCUMENTS

| | | |
|---|---|---|
| 7,057,598 B2 | 6/2006 | Azami et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,610 B2 | 4/2007 | Koyama |
| 7,211,825 B2 | 5/2007 | Shih et al |
| 7,265,390 B2 | 9/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,790 B2 | 10/2008 | Chen |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,485,896 B2 | 2/2009 | Yamazaki et al. |
| 7,501,293 B2 | 3/2009 | Ito et al. |
| 7,586,478 B2 | 9/2009 | Azami et al. |
| 7,674,650 B2 | 3/2010 | Akimoto et al. |
| 7,701,009 B2 | 4/2010 | Koyama |
| 7,710,384 B2 | 5/2010 | Azami et al. |
| 7,732,819 B2 | 6/2010 | Akimoto et al. |
| 7,903,079 B2 | 3/2011 | Azami et al. |
| 8,026,551 B2 | 9/2011 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0158829 A1 | 10/2002 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0240305 A1 | 12/2004 | Kato |
| 2005/0017302 A1 | 1/2005 | Hoffman |
| 2005/0199881 A1 | 9/2005 | Hoffman et al. |
| 2005/0199959 A1 | 9/2005 | Chiang et al. |
| 2005/0264514 A1 | 12/2005 | Kim et al. |
| 2006/0001637 A1 | 1/2006 | Pak et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063284 A1 | 3/2007 | Kawahara et al. |
| 2007/0090365 A1 | 4/2007 | Hayashi et al. |
| 2007/0108446 A1 | 5/2007 | Akimoto |
| 2007/0147165 A1 | 6/2007 | Kato |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0207575 A1 | 9/2007 | Taniguchi et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0073348 A1 | 3/2010 | Azami et al. |
| 2010/0079169 A1 | 4/2010 | Kim et al. |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2010/0244020 A1 | 9/2010 | Sakata et al. |
| 2010/0301326 A1 | 12/2010 | Miyairi et al. |
| 2011/0031499 A1 | 2/2011 | Kimura et al. |
| 2011/0063014 A1* | 3/2011 | Koyama et al. ............... 327/427 |
| 2011/0064186 A1 | 3/2011 | Koyama |
| 2011/0084263 A1 | 4/2011 | Yamazaki et al. |
| 2011/0109351 A1 | 5/2011 | Yamazaki et al. |
| 2011/0133177 A1 | 6/2011 | Suzawa et al. |
| 2011/0149189 A1 | 6/2011 | Azami et al. |
| 2011/0156025 A1* | 6/2011 | Shionoiri et al. ............... 257/43 |
| 2011/0199351 A1 | 8/2011 | Kurokawa |
| 2011/0204365 A1* | 8/2011 | Saito ............................... 257/57 |
| 2011/0248261 A1 | 10/2011 | Yamazaki |
| 2012/0013394 A1 | 1/2012 | Koyama |
| 2012/0061662 A1 | 3/2012 | Yamazaki et al. |
| 2012/0061668 A1 | 3/2012 | Miyairi et al. |
| 2012/0104385 A1 | 5/2012 | Godo et al. |
| 2012/0104386 A1 | 5/2012 | Miyairi et al. |
| 2012/0112191 A1 | 5/2012 | Kato et al. |
| 2012/0161127 A1 | 6/2012 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| JP | 2003-086808 A | 3/2003 |
|---|---|---|
| JP | 2004-103957 A | 4/2004 |
| JP | 2004-273614 A | 9/2004 |
| JP | 2004-273732 A | 9/2004 |
| JP | 2006-024350 A | 1/2006 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,Or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

(56) References Cited

OTHER PUBLICATIONS

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2NnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW'08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

US 6,774,400, 08/2004, Yamazaki et al. (withdrawn).

T.P. Ma et al.; "Unipolar CMOS Logic for Post-Si ULSI and TFT Technologies", ECS Transactions; Jun. 26, 2011; pp. 207-215; vol. 37, No. 1.

* cited by examiner

SEMICONDUCTOR DEVICE WITH SWITCH AND LOGIC CIRCUIT

BACKGROUND OF THE INVENTION

1. Field of the Invention

The present invention relates to a semiconductor device including a transistor and a method for driving the semiconductor device.

2. Description of the Related Art

A process of fabricating a semiconductor device such as a shift register can be simplified when the semiconductor device is composed of transistors of the same conductivity type, for example, composed of only n-channel transistors, as compared to when the semiconductor device is composed of p-channel transistors and n-channel transistors. A circuit that is composed of transistors of the same conductivity type and has a function similar to that of a complementary MOS (CMOS) is sometimes referred to as "unipolar CMOS". A shift register composed of transistors of the same conductivity type is disclosed in Patent Document 1, for example.

FIG. 7 is a circuit diagram illustrating the configuration of part of the shift register disclosed in Patent Document 1. In the shift register, a plurality of stages 80 illustrated in FIG. 7 can be cascaded. The stage 80 includes a transistor 81, a transistor 82, a transistor 83, a transistor 84, and a capacitor 85. All the transistors (the transistors 81 to 84) included in the stage 80 can be n-channel transistors. Thus, all the transistors included in the shift register can be n-channel transistors.

In the stage 80, a drain of the transistor 81 is connected to a terminal C1 and supplied with a clock signal CLK. A source of the transistor 81 is connected to an output terminal OUT and a drain of the transistor 82. A signal output from the output terminal OUT is an output signal of the stage 80. A gate of the transistor 81 is connected to a source of the transistor 83. A source of the transistor 82 is connected to a terminal VSS and supplied with a low power supply potential (e.g., a ground potential). A gate of the transistor 82 is connected to a terminal C2 and supplied with an inverted clock signal CLKB. The inverted clock signal CLKB is an inversion signal of the clock signal CLK (a signal having a logic level opposite to that of the clock signal CLK). A gate and a drain of the transistor 83 are connected to an input terminal N. The input terminal N is supplied with an output signal of the previous stage 80. The source of the transistor 83 is connected to a drain of the transistor 84. A source of the transistor 84 is connected to the terminal VSS and supplied with the low power supply potential (e.g., the ground potential). A gate of the transistor 84 is connected to the output terminal OUT of the subsequent stage 80. The capacitor 85 is provided between the gate and source of the transistor 81.

In the stage 80, a high-level potential of the output signal is a high-level potential of the clock signal CLK, and a low-level potential of the output signal is the low power supply potential. The shift register including the plurality of stages 80 drives a plurality of loads using output signals that are sequentially output from the plurality of stages 80. For example, when the shift register is used in a scan line driver circuit of a display device, the loads correspond to scan lines, elements connected to the scan lines, and the like.

REFERENCE

Patent Document 1: Japanese Published Patent Application No. 2006-024350

SUMMARY OF THE INVENTION

In the shift register disclosed in Patent Document 1, the high-level potential of the output signal is the high-level potential of the clock signal CLK. That is, a load (corresponding to an element driven by the shift register, a wiring to which a signal is input from the shift register, or the like) is driven with the high-level potential of the clock signal CLK. Consequently, a circuit that generates the clock signal CLK (hereinafter also referred to as "clock signal generator") requires high current drive capability. In order to enhance the current drive capability of the circuit, it is necessary to increase the size of elements constituting the circuit (e.g., the channel width and length of transistors) and to provide a buffer constituted of a large-sized element, for example, which results in the increase in area of the circuit. In view of the above, an object of one embodiment of the present invention is to provide a shift register that can operate with a clock signal generator with low current drive capability.

Note that the description of the object does not disturb the existence of other objects. An object other than the above will be apparent from and can be derived from the description in the specification, the drawings, the claims, and the like.

A semiconductor device according to one embodiment of the present invention includes a switch and a logic circuit having an input terminal to which an input signal is input through the switch in the on state. Note that the logic circuit is a circuit (e.g., an inverter circuit) that inverts the logic level of a signal input to the input terminal (or one of a plurality of input terminals) and outputs the inverted signal from the output terminal. The switch is turned on or off by a clock signal (or an inversion signal of the clock signal). The logic circuit is supplied with a high power supply potential from a wiring (hereinafter also referred to as "high power supply line"), and supplied with a low power supply potential from another wiring (hereinafter also referred to as "low power supply line"). The logic circuit inverts the logic level of a signal input to the input terminal (or one of a plurality of input terminals) and outputs the inverted signal from the output terminal by electrically connecting the output terminal to the high power supply line and/or the low power supply line. The output from the logic circuit is to be the output from the semiconductor device. Accordingly, a load (e.g., a bus line or an element connected to a bus line) driven by the semiconductor device is driven while being electrically connected to the high power supply line or the low power supply line. A clock signal generator may be included in the semiconductor device or may be an external circuit provided outside the semiconductor device. Note that the semiconductor device and a load may be collectively considered as a semiconductor device.

Here, all transistors included in the semiconductor device can have the same conductivity type. That is, transistors forming the switch and the logic circuit can all have the same conductivity type. In that case, the logic circuit includes a bootstrap circuit and corrects the output signal by using the bootstrap circuit. In other words, n-channel transistors can be used as all the transistors included in the semiconductor device, whereby the logic circuit can output the low power supply potential from the output terminal when the input signal is a high-level potential and output the high power supply potential from the output terminal by raising the potential of the output terminal with the bootstrap circuit when the input signal is a low-level potential. Alternatively, p-channel transistors can be used as all the transistors included in the semiconductor device, whereby the logic circuit can output the high power supply potential from the output terminal when the input signal is a low-level potential and output the low power supply potential from the output terminal by lowering the potential of the output terminal with the bootstrap circuit when the input signal is a low-level potential.

Further, the logic circuit can have a plurality of input terminals (an input terminal to which an input signal is input, and an inverted input terminal to which a signal with a logic level opposite to that of the input signal is input). The logic circuit can be configured to invert the logic level of the input signal input to the input terminal and output the inverted signal from the output terminal by controlling electrical connection between one of the high power supply line and the low power supply line and the output terminal with a signal input to the inverted input terminal, and by controlling electrical connection between the other of the high power supply line and the low power supply line and the output terminal with a signal input to the input terminal. For example, when the transistors included in the logic circuit are n-channel transistors, the logic circuit can be configured to invert the logic level of the input signal input to the input terminal and output the inverted signal from the output terminal in the following manner: a gate of a transistor provided between the high power supply line and the output terminal is electrically connected to the inverted input terminal such that the on/off state of the transistor is controlled by a signal input to the inverted input terminal, and a gate of a transistor provided between the low power supply line and the output terminal is electrically connected to the input terminal such that the on/off state of the transistor is controlled by a signal input to the input terminal. Alternatively, for example, when the transistors included in the logic circuit are p-channel transistors, the logic circuit can be configured to invert the logic level of the input signal input to the input terminal and output the inverted signal from the output terminal in the following manner: a gate of a transistor provided between the low power supply line and the output terminal is electrically connected to the inverted input terminal such that the on/off state of the transistor is controlled by a signal input to the inverted input terminal, and a gate of a transistor provided between the high power supply line and the output terminal is electrically connected to the input terminal such that the on/off state of the transistor is controlled by a signal input to the input terminal.

The transistor included in the semiconductor device includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. Here, one of the pair of gate electrodes is referred to as a gate of the transistor and the other thereof is referred to as a backgate of the transistor. The other of the pair of gate electrodes (backgate) can be electrically connected to a source of the transistor. Alternatively, the other of the pair of gate electrodes (backgate) can be electrically connected to the low power supply line when the transistor is an n-channel transistor, whereas the other of the pair of gate electrodes (backgate) can be electrically connected to the high power supply line when the transistor is a p-channel transistor. Note that one of the pair of gate electrodes (gate) may by electrically connected to the other of the pair of gate electrodes (backgate) such that they are collectively used as a gate of the transistor.

A plurality of transistors included in the semiconductor device each include a semiconductor layer in which a channel is formed and a pair of gate electrodes between which the semiconductor layer is sandwiched. One of the pair of gate electrodes overlaps with the semiconductor layer with a first gate insulating layer placed therebetween, and the other thereof overlaps with the semiconductor layer with a second gate insulating layer placed therebetween. It is possible that one of the pair of gate electrodes serves as the gate and the other thereof serves as the backgate in one or more of the transistors included in the semiconductor device, and that one of the pair of gate electrodes serves as the backgate and the other thereof serves as the gate in the other transistors included in the semiconductor device. That is, the positional relation between the gate and backgate of one or more of the transistors can be opposite to that of the other transistors included in the semiconductor device. For example, some of the transistors included in the semiconductor device can be bottom-gate transistors in which the gate is provided below the semiconductor layer, and the other transistors included in the semiconductor device can be top-gate transistors in which the gate is provided above the semiconductor layer. The backgate of the transistor can be electrically connected to the source thereof. Alternatively, the backgate can be electrically connected to the low power supply line when the transistor is an n-channel transistor, and electrically connected to the high power supply line when the transistor is a p-channel transistor. Note that the gate and the backgate may be electrically connected to each other such that they are collectively used as a gate of the transistor.

For example, a semiconductor device according to one embodiment of the present invention includes a switch and a logic circuit to which an input signal is input through the switch in the on state. Transistors forming the switch and the logic circuit are n-channel transistors. The switch is turned on or off by a clock signal. The logic circuit includes a bootstrap circuit, an input terminal to which the input signal is input, an inverted input terminal to which a signal with a logic level opposite to that of the input signal is input, and an output terminal. The logic circuit is supplied with a high power supply potential from a high power supply line, and supplied with a low power supply potential from a low power supply line. Electrical connection between the high power supply line and the output terminal is controlled by a signal input to the inverted input terminal and electrical connection between the low power supply line and the output terminal is controlled by a signal input to the input terminal, whereby the low power supply potential is output from the output terminal when the input signal is a high-level potential, whereas when the input signal is a low-level potential, the high power supply potential is output from the output terminal by raising a potential of the output terminal with the bootstrap circuit. Each of the n-channel transistors includes a semiconductor layer in which a channel is formed, and a pair of gate electrodes provided so that the semiconductor layer is placed therebetween. One of the pair of gate electrodes of the n-channel transistor overlaps with the semiconductor layer with a first gate insulating layer placed therebetween, and the other of the pair of gate electrodes overlaps with the semiconductor layer with a second gate insulating layer placed therebetween and is electrically connected to a source of the n-channel transistor.

For example, a semiconductor device according to another embodiment of the present invention includes a switch and a logic circuit to which an input signal is input through the switch in the on state. Transistors forming the switch and the logic circuit are p-channel transistors. The switch is turned on or off by a clock signal. The logic circuit includes a bootstrap circuit, an input terminal to which the input signal is input, an inverted input terminal to which a signal with a logic level opposite to that of the input signal is input, and an output terminal. The logic circuit is supplied with a high power supply potential from a high power supply line, and supplied with a low power supply potential from a low power supply line. Electrical connection between the low power supply line and the output terminal is controlled by a signal input to the inverted input terminal and electrical connection between the high power supply line and the output terminal is controlled by a signal input to the input terminal, whereby the high power supply potential is output from the output terminal when the input signal is a low-level potential, whereas when the input signal is a high-level potential, the low power supply potential is output from the output terminal by lowering a potential of the output terminal with the bootstrap circuit. Each of the p-channel transistors includes a semiconductor layer in which a channel is formed, and a pair of gate electrodes provided so that the semiconductor layer is placed therebetween. One of the pair of gate electrodes of the p-channel transistor overlaps with the semiconductor layer with a first gate insulating layer placed therebetween, and the other of the pair of gate electrodes overlaps with the semiconductor layer with a second gate insulating layer placed therebetween and is electrically connected to a source of the p-channel transistor.

In the transistor, the semiconductor layer in which the channel is formed can be formed using an oxide semiconductor. Alternatively, the semiconductor layer may be formed using silicon, such as amorphous silicon, polycrystalline silicon, or single crystal silicon.

The semiconductor device according to one embodiment of the present invention may be a display device, such as a display device including a liquid crystal element or a display device including a light-emitting element such as an electroluminescent (EL) element.

The semiconductor device according to one embodiment of the present invention may be an image sensor.

The semiconductor device according to one embodiment of the present invention may be an arithmetic circuit or a memory device. Note that CPUs and programmable LSIs are included in the category of arithmetic circuits.

One embodiment of the present invention can be an electronic device including any of the above semiconductor devices.

The semiconductor device according to one embodiment of the present invention includes the switch and the logic circuit having the input terminal to which an input signal is input through the switch in the on state. The switch is turned on or off by a clock signal (or an inversion signal of the clock signal). The logic circuit inverts the logic level of the input signal and outputs the inverted signal from the output terminal by electrically connecting the output terminal to the high power supply line and/or the low power supply line. The output from the logic circuit is to be the output from the semiconductor device. Accordingly, a load driven by the semiconductor device is driven while being electrically connected to the high power supply line or the low power supply line. The semiconductor device having such a structure does not drive a load by using a high-level potential (or a low-level potential) of the clock signal, and thus a clock signal generator does not need high current drive capability. Consequently, the area of the clock signal generator can be reduced.

When all the transistors included in the semiconductor device have the same conductivity type, the process of fabricating the semiconductor device can be simplified. Thus, the yield can be increased and the costs can be reduced. In that case, the logic circuit is configured to correct the output signal by using a bootstrap circuit. In such a manner, the logic circuit constituted of transistors of the same conductivity type can output an output signal with an amplitude voltage that is (substantially) equal to the power supply voltage (corresponding to a difference between the high power supply potential and the low power supply potential).

Further, the logic circuit has a plurality of input terminals (an input terminal to which an input signal is input, and an inverted input terminal to which a signal with a logic level opposite to that of the input signal is input). The logic circuit can be configured to invert the logic level of an input signal input to the input terminal and output the inverted signal from the output terminal by controlling electrical connection between the output terminal and one of the high power supply line and the low power supply line with a signal input to the inverted input terminal, and by controlling electrical connection between the output terminal and the other of the high power supply line and the low power supply line with a signal input to the input terminal. Accordingly, in the logic circuit composed of transistors of the same conductivity type, one of the transistor provided between the high power supply line and the output terminal and the transistor provided between the low power supply line and the output terminal can be turned on, while the other of these two transistors can be turned off. As a result, the through current in a circuit provided between the high power supply line and the low power supply line can be suppressed.

The transistor included in the semiconductor device includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. The other of the pair of gate electrodes (backgate) of the transistor can be electrically connected to a source thereof. Alternatively, the other of the pair of gate electrodes (backgate) can be electrically connected to the low power supply line when the transistor is an n-channel transistor, whereas the other of the pair of gate electrodes (backgate) can be electrically connected to the high power supply line when the transistor is a p-channel transistor. Thus, the transistor can be prevented from being placed in a normally-on state, resulting in reduction in malfunction of the semiconductor device and reduction in through current.

In such a manner, a unipolar CMOS having a function similar to that of a CMOS can be fabricated by using transistors of the same conductivity type. In addition, the semiconductor device according to one embodiment of the present invention can drive a load (e.g., a bus line) without requiring high current supply capability of a clock signal generator.

BRIEF DESCRIPTION OF THE DRAWINGS

In the accompanying drawings.

DETAILED DESCRIPTION OF THE INVENTION

Figure 1:
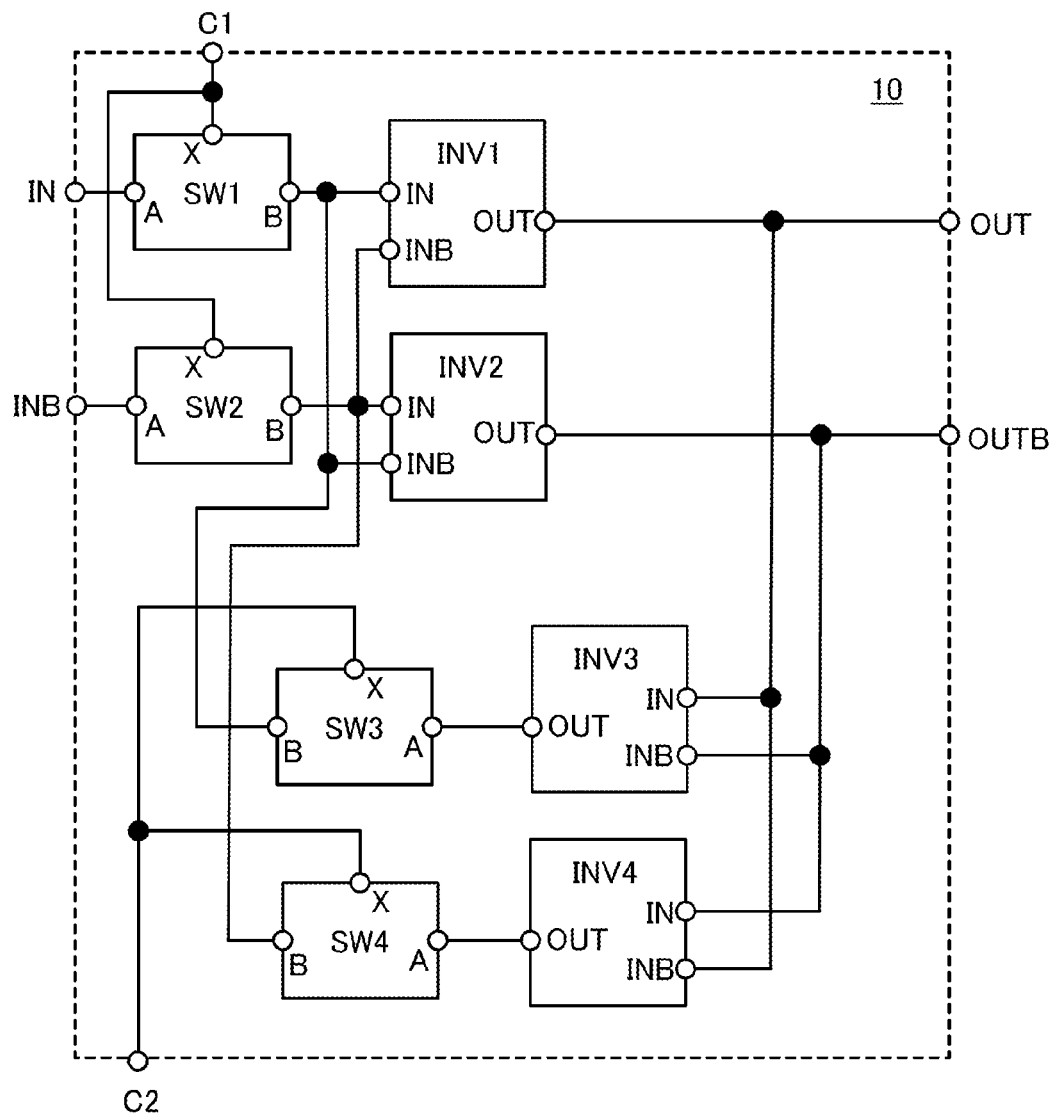
FIG. 1 illustrates a configuration of a semiconductor device described in Embodiment 1.

Embodiments of the present invention will be hereinafter described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the description of the embodiments below. In structures given below, the same portions or portions having similar functions are denoted by the same reference numerals in different drawings, and explanation thereof will not be repeated.

Note that the size, thickness, and regions in the drawings are exaggerated for clarity in some cases. Thus, an embodiment of the present invention is not limited to such scales. Alternatively, drawings are perspective views of ideal examples. Thus, an embodiment of the present invention is not limited to shapes illustrated in the drawings and can include variations in shape due to a fabrication technique or dimensional deviation, for example.

Note that an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, or a layer). Accordingly, a connection relation other than those shown in drawings and texts is also included without limitation to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. When a signal output from X is transmitted to Y, it can be said that X and Y are functionally connected even if another circuit is provided between X and Y.

Note that an explicit description "X and Y are connected" means that X and Y are electrically connected, X and Y are functionally connected, and X and Y are directly connected. That is, the explicit description "X and Y are electrically connected" is the same as an explicit simple expression "X and Y are connected".

Even when independent components are electrically connected to each other in a circuit diagram, there is the case where one conductive layer has functions of a plurality of components (e.g., a wiring and an electrode), such as the case where part of a wiring functions as an electrode. The "electrical connection" in this specification includes in its category such a case where one conductive layer has functions of a plurality of components.

(Embodiment 1)

In Embodiment 1, a specific embodiment of a semiconductor device according to the present invention will be described with reference to FIG. 1, FIGS. 2A to 2D, and FIG. 3.

The semiconductor device can include a stage 10 illustrated in FIG. 1. The stage 10 includes an input terminal N, an inverted input terminal NB, a switch SW1, a switch SW2, a switch SW3, a switch SW4, a logic circuit INV1, a logic circuit INV2, a logic circuit INV3, a logic circuit INV4, an output terminal OUT, and an inverted output terminal OUTB.

The logic circuits INV1 to INV4 each have an input terminal N, an inverted input terminal NB, and an output terminal OUT and invert a signal input to the input terminal N and output the inverted signal from the output terminal OUT. The logic circuits INV1 to INV4 can be called inverters. The output terminal OUT of the logic circuit NV1 is connected to the input terminal N of the logic circuit INV3, the inverted input terminal NB of the logic circuit INV4, and the output terminal OUT. The output terminal OUT of the logic circuit INV2 is connected to the inverted input terminal NB of the logic circuit INV3, the input terminal N of the logic circuit INV4, and the inverted output terminal OUTB. The switches SW1 to SW4 each have a function of determining electrical continuity between a terminal A and a terminal B depending on a signal input to a terminal X. Thus, the switch SW1 has a function of determining electrical continuity between the input terminal N and the input terminal N of the logic circuit INV1 and between the input terminal N and the inverted input terminal NB of the logic circuit INV2 depending on a signal input to the terminal X. The switch SW2 has a function of determining electrical continuity between the inverted input terminal NB and the inverted input terminal NB of the logic circuit INV1 and between the inverted input terminal NB and the input terminal IN of the logic circuit INV2 depending on a signal input to the terminal X. The terminals X of the switches SW1 and SW2 are connected to a terminal C1 to which one of a clock signal and an inversion signal of the clock signal (inverted clock signal) is input. The switch SW3 has a function of determining electrical continuity between the output terminal OUT of the logic circuit INV3 and the input terminal N of the logic circuit INV1 and between the output terminal OUT of the logic circuit INV3 and the inverted input terminal INB of the logic circuit INV2 depending on a signal input to the terminal X. The switch SW4 has a function of determining electrical continuity between the output terminal OUT of the logic circuit INV4 and the inverted input terminal INB of the logic circuit INV1 and between the output terminal OUT of the logic circuit INV4 and the input terminal IN of the logic circuit INV2 depending on a signal input to the terminal X. The terminals X of the switches SW3 and SW4 are connected to a terminal C2 to which the other of the clock signal and the inverted clock signal is input.

In the stage 10 illustrated in FIG. 1, when the switches SW1 and SW2 are turned on by the clock signal (or the inverted clock signal), the switches SW3 and SW4 are turned off by the inverted clock signal (or the clock signal), whereas when the switches SW1 and SW2 are turned off by the clock signal (or the inverted clock signal), the switches SW3 and SW4 are turned on by the inverted clock signal (or the clock signal). Accordingly, the stage 10 has a function of holding a signal input to the input terminal N in synchronization with the clock signal. The stage 10 illustrated in FIG. 1 can therefore be called a flip-flop circuit or a latch circuit.

One embodiment of a specific configuration of each of the logic circuits INV1 to INV4 will be described with reference to FIGS. 2A and 2B.

Figure 2A:
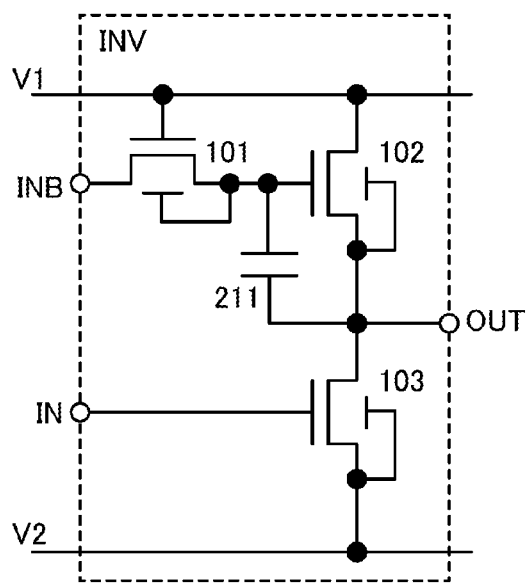
FIGS. 2A and 2B each illustrate a configuration of a logic circuit, and FIGS. 2C and 2D each illustrate a configuration of a switch.

The logic circuits INV1 to INV4 each can be a logic circuit NV illustrated in FIG. 2A. The logic circuit NV illustrated in FIG. 2A includes a transistor 101, a transistor 102, a transistor 103, and a capacitor 211. A gate of the transistor 101 is connected to a power supply line V1 to which a power supply potential V1 is supplied. A drain of the transistor 101 is connected to the inverted input terminal NB. A source of the transistor 101 is connected to a gate of the transistor 102. A drain of the transistor 102 is connected to the power supply line V1. A source of the transistor 102 is connected to the output terminal OUT. A gate of the transistor 103 is connected to the input terminal N. A source of the transistor 103 is connected to a power supply line V2 to which a power supply potential V2 different from the power supply potential V1 is supplied. A drain of the transistor 103 is connected to the output terminal OUT. One of a pair of electrodes of the capacitor 211 is connected to the gate of the transistor 102, and the other thereof is connected to the source of the transistor 102. Note that parasitic capacitance of the transistor 102 and the like can be actively used instead of providing the capacitor 211.

The transistors 101 to 103 can be of the same conductivity type. When the transistors 101 to 103 are n-channel transistors, the power supply potential V1 is set to be higher than the power supply potential V2 and the power supply potential V2 is, for example, a ground potential. That is, the power supply potential V1 is a high power supply potential and the power supply potential V2 is a low power supply potential. On the other hand, when the transistors 101 to 103 are p-channel transistors, the power supply potential V1 is set to be lower than the power supply potential V2 and is a ground potential, for example. That is, the power supply potential V1 is a low power supply potential and the power supply potential V2 is a high power supply potential.

Each of the transistors 101 to 103 includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. Here, one of the pair of gate electrodes is called a gate of the transistor and the other thereof is called a backgate of the transistor. The other of the pair of gate electrodes (backgate) of the transistor can be connected to the source thereof. FIG. 2A schematically illustrates a configuration in which each of the transistors 101 to 103 has the gate and the backgate that is connected to the source. Note that the other of the pair of gate electrodes (backgate) can be connected to the power supply line V2. That is, the other of the pair of gate electrodes (backgate) can be connected to the low power supply line when the transistor is an n-channel transistor, whereas the other of the pair of gate electrodes (backgate) can be connected to the high power supply line when the transistor is a p-channel transistor. Thus, the transistors 101 to 103 can be prevented from being placed in a normally-on state.

It is possible that one of the pair of gate electrodes serves as the gate and the other thereof serves as the backgate in one or more of the transistors 101 to 103, and that one of the pair of gate electrodes serves as the backgate and the other thereof serves as the gate in the rest of them. For example, it is possible that one of the pair of gate electrodes serves as the gate and the other thereof serves as the backgate in the transistor 102, and that one of the pair of gate electrodes serves as the backgate and the other thereof serves as the gate in the transistor 103. That is, the positional relation between the gate and the backgate of the transistor 102 can be opposite to that of the transistor 103. For example, one of the transistors 102 and 103 can be a bottom-gate transistor in which the gate is provided below the semiconductor layer, and the other of the transistors 102 and 103 can be a top-gate transistor in which the gate is provided above the semiconductor layer. The backgate of the transistor can be electrically connected to the source thereof. Alternatively, the backgate can be electrically connected to the low power supply line when the transistor is an n-channel transistor, and electrically connected to the high power supply line when the transistor is a p-channel transistor.

The operation of the logic circuit NV illustrated in FIG. 2A will be described.

First, the operation of the logic circuit NV will be described assuming that the transistors 101 to 103 are n-channel transistors. When a high-level potential is input to the input terminal N and a low-level potential is input to the inverted input terminal NB, the transistor 103 is turned on and the transistor 102 is turned off. Thus, the output terminal OUT is connected to the power supply line V2 and the power supply potential V2 (low power supply potential) is output from the output terminal OUT. When a low-level potential is input to the input terminal N and a high-level potential is input to the inverted input terminal NB, the transistor 103 is turned off and the transistor 102 is turned on. Thus, the output terminal OUT is connected to the power supply line V1. Here, when the potential of the source of the transistor 101 reaches a certain potential (a potential that is lower than the power supply potential V1, which is the potential of the gate of the transistor 101, by the threshold voltage of the transistor 101) by the high-level potential input to the inverted input terminal NB, the transistor 101 is turned off and the source of the transistor 101 is brought into a floating state. The potential of the source of the transistor 102 keeps rising, so that the potential of the gate of the transistor 102 is raised by capacitive coupling due to the capacitor 211. Accordingly, the potential of the output terminal OUT is raised to the power supply potential V1 (or a potential close thereto), and the power supply potential V1 (high power supply potential) is output from the output terminal OUT. In other words, it can be said that the logic circuit NV illustrated in FIG. 2A includes a bootstrap circuit.

Next, the operation of the logic circuit NV will be described assuming that the transistors 101 to 103 are p-channel transistors. When a low-level potential is input to the input terminal N and a high-level potential is input to the inverted input terminal NB, the transistor 103 is turned on and the transistor 102 is turned off. Thus, the output terminal OUT is connected to the power supply line V2 and the power supply potential V2 (high power supply potential) is output from the output terminal OUT. When a high-level potential is input to the input terminal N and a low-level potential is input to the inverted input terminal NB, the transistor 103 is turned off and the transistor 102 is turned on. Thus, the output terminal OUT is connected to the power supply line V1. Here, when the potential of the source of the transistor 101 reaches a certain potential (a potential that is higher than the power supply potential V1, which is the potential of the gate of the transistor 101, by the threshold voltage of the transistor 101) by the low-level potential input to the inverted input terminal NB, the transistor 101 is turned off and the source of the transistor 101 is brought into a floating state. The potential of the source of the transistor 102 keeps decreasing, so that the potential of the gate of the transistor 102 is lowered by capacitive coupling due to the capacitor 211. Accordingly, the potential of the output terminal OUT is lowered to the power supply potential V1 (or a potential close thereto), and the power supply potential V1 (low power supply potential) is output from the output terminal OUT. In other words, it can be said that the logic circuit NV in FIG. 2A includes a bootstrap circuit.

Figure 2B:
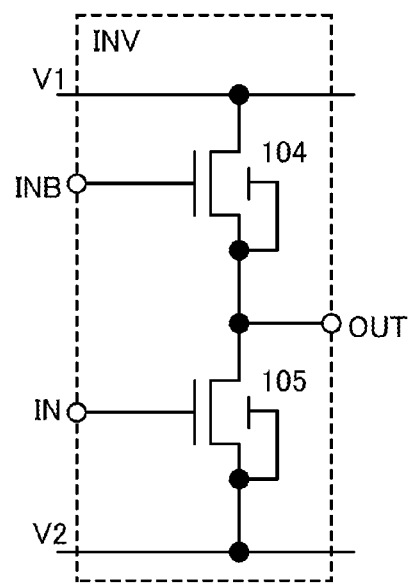

As another example, the logic circuits INV1 and INV2 each can be the logic circuit NV illustrated in FIG. 2A, and the logic circuits INV3 and INV4 each can be a logic circuit NV illustrated in FIG. 2B. The logic circuit NV illustrated in FIG. 2B includes a transistor 104 and a transistor 105. A gate of the transistor 104 is connected to the inverted input terminal NB. A drain of the transistor 104 is connected to the power supply line V1 to which the power supply potential V1 is supplied. A source of the transistor 104 is connected to the output terminal OUT. A gate of the transistor 105 is connected to the input terminal N. A source of the transistor 105 is connected to the power supply line V2 to which the power supply potential V2 different from the power supply potential V1 is supplied. A drain of the transistor 105 is connected to the output terminal OUT.

The transistors 104 and 105 can be of the same conductivity type. When the transistors 104 and 105 are n-channel transistors, the power supply potential V1 is set to be higher than the power supply potential V2 and the power supply potential V2 is, for example, a ground potential. That is, the power supply potential V1 is the high power supply potential and the power supply potential V2 is the low power supply potential. On the other hand, when the transistors 104 and 105 are p-channel transistors, the power supply potential V1 is set to be lower than the power supply potential V2 and is a ground potential, for example. That is, the power supply potential V1 is the low power supply potential and the power supply potential V2 is the high power supply potential.

Each of the transistors 104 and 105 includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. Here, one of the pair of gate electrodes is called a gate of the transistor and the other thereof is called a backgate of the transistor. The other of the pair of gate electrodes (backgate) of the transistor can be connected to the source thereof FIG. 2B schematically illustrates a configuration in which each of the transistors 104 and 105 has the gate and the backgate that is connected to the source. Note that the other of the pair of gate electrodes (backgate) can be connected to the power supply line V2. That is, the other of the pair of gate electrodes (backgate) can be connected to the low power supply line when the transistor is an n-channel transistor, whereas the other of the pair of gate electrodes (backgate) can be connected to the high power supply line when the transistor is a p-channel transistor. Thus, the transistors 104 and 105 can be prevented from being placed in a normally-on state.

It is possible that one of the pair of gate electrodes serves as the gate and the other thereof serves as the backgate in one of the transistors 104 and 105, and that one of the pair of gate electrodes serves as the backgate and the other thereof serves as the gate in the other of the transistors 104 and 105. For example, it is possible that one of the pair of gate electrodes serves as the gate and the other thereof serves as the backgate in the transistor 104, and that one of the pair of gate electrodes serves as the backgate and the other thereof serves as the gate in the transistor 105. That is, the positional relation between the gate and the backgate of the transistor 104 can be opposite to that of the transistor 105. For example, one of the transistors 104 and 105 can be a bottom-gate transistor in which the gate is provided below the semiconductor layer, and the other of the transistors 104 and 105 can be a top-gate transistor in which the gate is provided above the semiconductor layer. The backgate of the transistor can be electrically connected to the source thereof. Alternatively, the backgate can be electrically connected to the low power supply line when the transistor is an n-channel transistor, and electrically connected to the high power supply line when the transistor is a p-channel transistor.

The operation of the logic circuit NV illustrated in FIG. 2B will be described.

First, the operation of the logic circuit NV will be described assuming that the transistors 104 and 105 are n-channel transistors. When a high-level potential is input to the input terminal N and a low-level potential is input to the inverted input terminal NB, the transistor 104 is turned off and the transistor 105 is turned on. Thus, the output terminal OUT is connected to the power supply line V2 and the power supply potential V2 (low power supply potential) is output from the output terminal OUT. When a low-level potential is input to the input terminal N and a high-level potential is input to the inverted input terminal NB, the transistor 104 is turned on and the transistor 105 is turned off. Thus, the output terminal OUT is connected to the power supply line V1. Note that the potential output from the output terminal OUT cannot be made higher than a potential that is lower than the high-level potential input to the inverted input terminal NB (e.g., the power supply potential V1) by the threshold voltage of the transistor 104.

Next, the operation of the logic circuit NV will be described assuming that the transistors 104 and 105 are p-channel transistors. When a low-level potential is input to the input terminal IN and a high-level potential is input to the inverted input terminal NB, the transistor 104 is turned off and the transistor 105 is turned on. Thus, the output terminal OUT is connected to the power supply line V2 and the power supply potential V2 (high power supply potential) is output from the output terminal OUT. When a high-level potential is input to the input terminal IN and a low-level potential is input to the inverted input terminal NB, the transistor 104 is turned on and the transistor 105 is turned off. Thus, the output terminal OUT is connected to the power supply line V1. Note that the potential output from the output terminal OUT cannot be made lower than a potential that is higher than the low-level potential input to the inverted input terminal NB (e.g., the power supply potential V1) by the threshold voltage of the transistor 104.

As described above, the logic circuit NV illustrated in FIG. 2B is also a circuit that inverts the logic level of a signal input to the input terminal IN and outputs the inverted signal from the output terminal OUT, and thus can be called an inverter. Note that the logic circuit NV in FIG. 2B does not include a bootstrap circuit and thus cannot output an output signal with a predetermined amplitude, which is equal to the power supply voltage (corresponding to a difference between the high power supply potential and the low power supply potential, that is, $|V1-V2|$). However, the configuration of the logic circuit NV illustrated in FIG. 2B can be simpler than that of the logic circuit NV including the bootstrap circuit illustrated in FIG. 2A.

Here, in FIG. 1, the outputs from the logic circuits INV3 and INV4 are input through the switches SW3 and SW4 to the logic circuits INV1 and INV2, and the output signal from the logic circuit INV1 and the output signal from the logic circuit INV2 are to be the output signal from the output terminal OUT and the output signal from the inverted output terminal OUTB, respectively, of each stage. For that reason, even if the logic circuits INV3 and INV4 cannot output an output signal with an amplitude that is (substantially) equal to the power supply voltage (corresponding to a difference between the high power supply potential and the low power supply potential, that is, |V1−V2|), the logic circuits INV1 and INV2 amplify the outputs from the logic circuits INV3 and INV4, and output signals with an amplitude that is (substantially) equal to the power supply voltage are output from the output terminal OUT and the inverted output terminal OUTB of the stage 10. Consequently, a semiconductor device that can output a signal with a predetermined amplitude can be provided with a simpler circuit configuration.

Figure 2C:
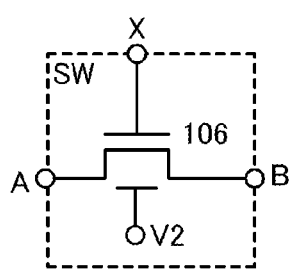

In FIG. 1, each of the switches SW1 and SW2 can be a switch SW composed of a transistor 106 illustrated in FIG. 2C. A gate of the transistor 106 can be connected to the terminal X. One of a source and a drain of the transistor 106 can be connected to the terminal A, and the other thereof can be connected to the terminal B. The transistor 106 includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. Here, one of the pair of gate electrodes is called a gate of the transistor and the other thereof is called a backgate of the transistor. The other of the pair of gate electrodes (backgate) can be connected to the power supply line V2. FIG. 2C schematically illustrates a configuration in which the transistor 106 has the gate and the backgate that is connected to the power supply line V2. That is, the other of the pair of gate electrodes (backgate) can be connected to the low power supply line when the transistor is an n-channel transistor, whereas the other of the pair of gate electrodes (backgate) can be connected to the high power supply line when the transistor is a p-channel transistor. Note that the other of the pair of gate electrodes (backgate) of the transistor 106 can be connected to the source thereof. Thus, the transistor 106 can be prevented from being placed in a normally-on state.

Figure 2D:
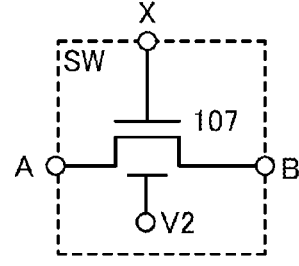

In FIG. 1, each of the switches SW3 and SW4 can be a switch SW composed of a transistor 107 illustrated in FIG. 2D. A gate of the transistor 107 can be connected to the terminal X. One of a source and a drain of the transistor 107 can be connected to the terminal A, and the other thereof can be connected to the terminal B. The transistor 107 includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. Here, one of the pair of gate electrodes is referred to as a gate of the transistor and the other thereof is referred to as a backgate of the transistor. FIG. 2D schematically illustrates a configuration in which the transistor 107 has the gate and the backgate that is connected to the power supply line V2. That is, the other of the pair of gate electrodes (backgate) can be connected to the low power supply line when the transistor is an n-channel transistor, whereas the other of the pair of gate electrodes (backgate) can be connected to the high power supply line when the transistor is a p-channel transistor. Note that the other of the pair of gate electrodes (backgate) of the transistor 107 can be connected to the source thereof. Thus, the transistor 107 can be prevented from being placed in a normally-on state.

Here, the requisite current drive capability of the switch is lower than that of the logic circuit, so that the size of the transistor composed of the switch can be made smaller than that of the transistor included in the logic circuit. That is, the channel width (W, also referred to as the gate width) (or the ratio (W/L) of channel width to channel length (L, also referred to as the gate length)) of the transistors 106 and 107 can be designed to be smaller than that of any or all of the transistors 101 to 105. Thus, the increase in integration and reduction in size of the semiconductor device can be achieved.

Since the logic circuits INV3 and INV4 do not directly drive a load connected to the output terminal OUT, their requisite current drive capability is lower than that of the logic circuits INV1 and INV2. Therefore, the channel width (W) (or the ratio (W/L) of channel width to channel length (L)) of the transistors included in the logic circuits INV3 and INV4 (the transistors 101 to 103, in particular the transistors 102 and 103, or the transistors 104 and 105) can be made smaller than that of the transistors included in the logic circuits INV1 and INV2 (the transistors 101 to 103, in particular the transistors 102 and 103). Thus, the increase in integration and reduction in size of the semiconductor device can be achieved.

Since the transistor 101 in the logic circuit NV illustrated in FIG. 2A does not directly drive a load connected to the output terminal OUT, its requisite current drive capability is lower than that of the transistors 102 and 103. For that reason, the channel width (W) (or the ratio (W/L) of channel width to channel length (L)) of the transistor 101 can be made smaller than that of the transistors 102 and 103.

Figure 3:
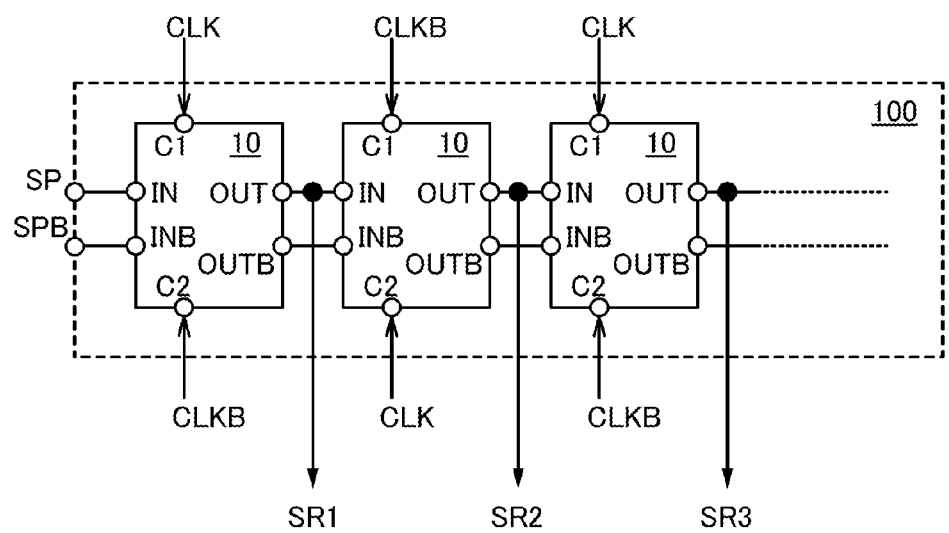
FIG. 3 illustrates a semiconductor device including a plurality of stages.

The semiconductor device according to one embodiment of the present invention can include a plurality of stages 10 illustrated in FIG. 1. For example, as illustrated in FIG. 3, a semiconductor device 100 can include a plurality of stages 10 that are cascaded so that the input terminal N is connected to the output terminal OUT of the previous stage and the inverted input terminal NB is connected to the inverted output terminal OUTB of the previous stage. Here, in adjacent two stages among the plurality of stages 10, the logic levels of signals input to the terminals C1 can be different from each other (i.e., the logic levels of signals input to the terminals C2 can be different from each other). For example, the clock signal can be input to the terminal C1 and the inverted clock signal can be input to the terminal C2 in one stage 10, and the inverted clock signal can be input to the terminal C1 and the clock signal can be input to the terminal C2 in the stage 10 next to the one stage 10. In FIG. 3, the clock signal is represented by CLK, and the inversion signal of the clock signal is represented by CLKB. Signals input to the input terminal IN and the inverted input terminal NB of the first stage among the cascaded stages 10 can be signals with opposite logic levels. In FIG. 3, a signal SP and an inversion signal SPB of the signal SP are input to the input terminal N and the inverted input terminal NB, respectively, of the first stage.

The semiconductor device 100 illustrated in FIG. 3 has a function of holding a signal that is input to the input terminal N of the first stage sequentially in the stages 10 in synchronization with the clock signal. The semiconductor device 100 can therefore be called a shift register. The signal SP can be called a start pulse. The semiconductor device 100 has a function of sequentially shifting the start pulse in synchronization with the clock signal CLK and outputting the shifted pulses as outputs SR1, SR2, SR3 . . . . The semiconductor device 100 can drive a load with the outputs SR1, SR2, SR3 . . . . Although the outputs SR1 to SR3 are set as output signals from the output terminal OUT of each stage 10 here, they are not limited to these and may be output signals from the inverted output terminal OUTB of each stage 10, for example. Alternatively, only outputs SR2, SR4, SR6 . . . of even-numbered stages 10 may be used as outputs of the semiconductor device 100 to drive a load.

The semiconductor device shown in this embodiment includes the switches (the switches SW1 to SW4) and the logic circuits having the input terminal to which an input signal is input through the switch in the on state (the logic circuits INV1 to INV4). The switch is turned on or off by a clock signal (or an inversion signal of the clock signal). The logic circuit inverts the logic level of the input signal and outputs the inverted signal from the output terminal by connecting the output terminal to the high power supply line or the low power supply line. The output from the logic circuit is to be the output from the semiconductor device. Accordingly, a load driven by the semiconductor device is driven while being connected to the high power supply line or the low power supply line. The semiconductor device having such a structure does not drive a load by using a high-level potential (or a low-level potential) of the clock signal, and thus a clock signal generator does not need high current drive capability. Consequently, the area of the clock signal generator can be reduced.

When all the transistors included in the semiconductor device have the same conductivity type, the process of fabricating the semiconductor device can be simplified. Thus, the yield can be increased and the costs can be reduced. In that case, the logic circuits (all the logic circuits INV1 to INV4 or only the logic circuits INV3 and INV4) are configured to correct the output signal by using a bootstrap circuit. In such a manner, the logic circuit constituted of transistors of the same conductivity type can output an output signal with an amplitude voltage that is (substantially) equal to the power supply voltage (corresponding to a difference between the high power supply potential and the low power supply potential).

Further, the logic circuit has a plurality of input terminals (an input terminal to which an input signal is input, and an inverted input terminal to which a signal with a logic level opposite to that of the input signal is input). The logic circuit can be configured to invert the logic level of an input signal input to the input terminal and output the inverted signal from the output terminal by controlling connection between the output terminal and one of the high power supply line and the low power supply line with a signal input to the inverted input terminal, and by controlling connection between the output terminal and the other of the high power supply line and the low power supply line with a signal input to the input terminal. Accordingly, in the logic circuit composed of transistors of the same conductivity type, one of the transistor provided between the high power supply line and the output terminal and the transistor provided between the low power supply line and the output terminal can be turned on, while the other of these two transistors can be turned off. As a result, the through current in a circuit provided between the high power supply line and the low power supply line can be suppressed.

The transistors included in the semiconductor device each include a semiconductor layer in which a channel is formed and a pair of gate electrodes between which the semiconductor layer is sandwiched. One of the pair of gate electrodes can overlap with the semiconductor layer with the first gate insulating layer placed therebetween, and the other thereof can overlap with the semiconductor layer with the second gate insulating layer placed therebetween. The other of the pair of gate electrodes (backgate) of the transistor can be connected to the source thereof. Alternatively, the other of the pair of gate electrodes (backgate) can be connected to the low power supply line when the transistor is an n-channel transistor, and can be connected to the high power supply line when the transistor is a p-channel transistor. Thus, the transistors can be prevented from being placed in a normally-on state, resulting in reduction in malfunction of the semiconductor device and reduction in through current.

This embodiment can be freely combined with any of the other embodiments.

(Embodiment 2)

In Embodiment 2, a specific embodiment of a semiconductor device according to the present invention will be described with reference to FIG. 4 and FIG. 5.

Figure 4:
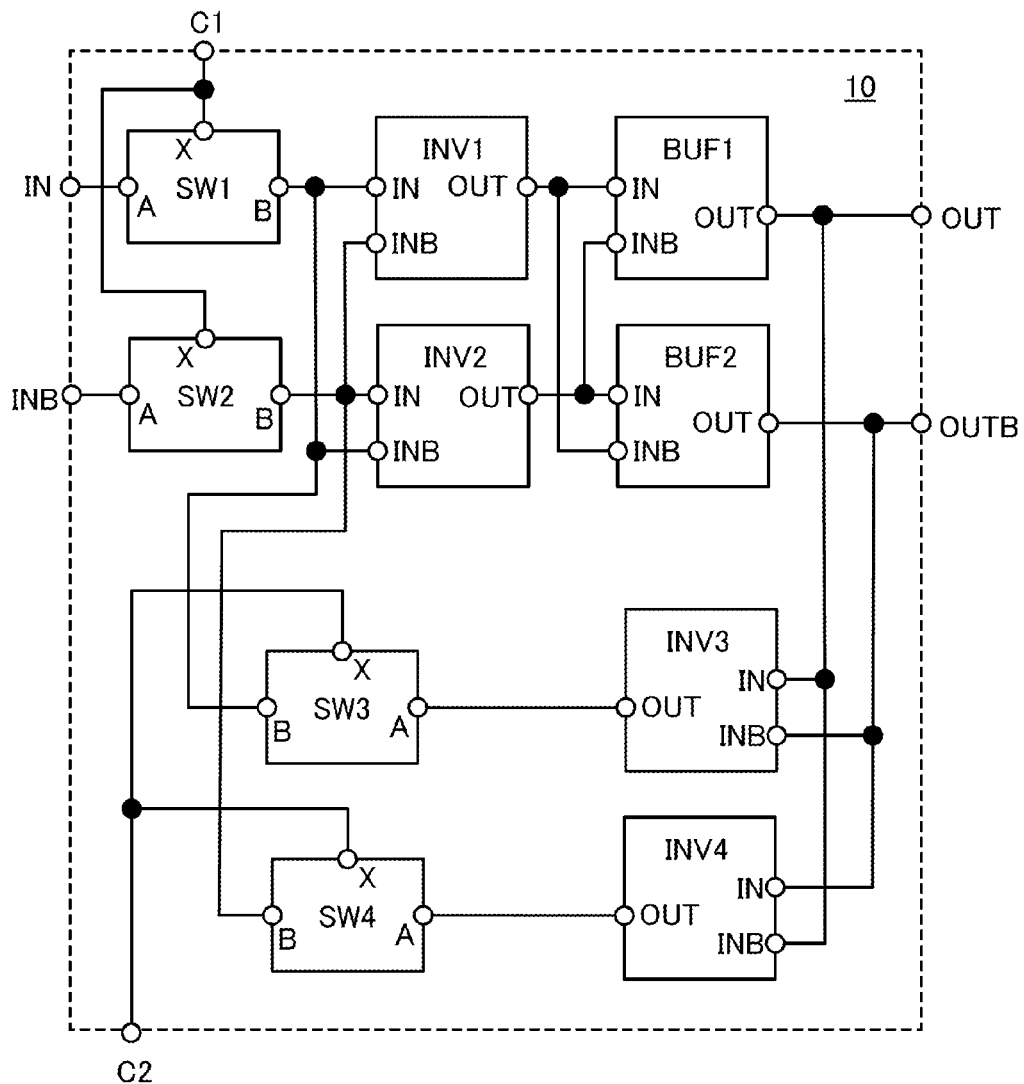
FIG. 4 illustrates a configuration of a semiconductor device described in Embodiment 2.

The semiconductor device can include a stage 10 illustrated in FIG. 4. The stage 10 includes an input terminal N, an inverted input terminal NB, a switch SW1, a switch SW2, a switch SW3, a switch SW4, a logic circuit INV1, a logic circuit INV2, a logic circuit INV3, a logic circuit INV4, an amplifier circuit BUF1, an amplifier circuit BUF2, an output terminal OUT, and an inverted output terminal OUTB.

Each of the logic circuits INV1 to INV4 has an input terminal N, an inverted input terminal NB, and an output terminal OUT and inverts a signal input to the input terminal N and outputs the inverted signal from the output terminal OUT. The logic circuits INV1 to INV4 can be called inverters. Each of the amplifier circuits BUF1 and BUF2 has an input terminal N, an inverted input terminal NB, and an output terminal OUT and transforms (lowers) the impedance to output, from the output terminal OUT, a signal input to the input terminal N. The output terminal OUT of the logic circuit INV1 is connected to the input terminal N of the amplifier circuit BUF1 and the inverted input terminal NB of the amplifier circuit BUF2. The output terminal OUT of the logic circuit INV2 is connected to the inverted input terminal NB of the amplifier circuit BUF1 and the input terminal N of the amplifier circuit BUF2. The output terminal OUT of the amplifier circuit BUF1 is connected to the input terminal IN of the logic circuit INV3, the inverted input terminal NB of the logic circuit INV4, and the output terminal OUT. The output terminal OUT of the amplifier circuit BUF2 is connected to the inverted input terminal NB of the logic circuit INV3, the input terminal N of the logic circuit INV4, and the inverted output terminal OUTB. The switches SW1 to SW4 each have a function of determining electrical continuity between a terminal A and a terminal B depending on a signal input to a terminal X. Thus, the switch SW1 has a function of determining electrical continuity between the input terminal N and the input terminal N of the logic circuit INV1 and between the input terminal N and the inverted input terminal INB of the logic circuit INV2 depending on a signal input to the terminal X. The switch SW2 has a function of determining electrical continuity between the inverted input terminal NB and the inverted input terminal INB of the logic circuit INV1 and between the inverted input terminal NB and the input terminal N of the logic circuit INV2 depending on a signal input to the terminal X. The terminals X of the switches SW1 and SW2 are connected to a terminal C1 to which one of a clock signal and an inversion signal of the clock signal (inverted clock signal) is input. The switch SW3 has a function of determining electrical continuity between the output terminal OUT of the logic circuit INV3 and the input terminal N of the logic circuit INV1 and between the output terminal OUT of the logic circuit INV3 and the inverted input terminal NB of the logic circuit INV2 depending on a signal input to the terminal X. The switch SW4 has a function of determining electrical continuity between the output terminal OUT of the logic circuit INV4 and the inverted input terminal NB of the logic circuit INV1 and between the output terminal OUT of the logic circuit INV4 and the input terminal N of the logic circuit INV2 depending on a signal input to the terminal X. The terminals X of the switches SW3 and SW4 are connected to a terminal C2 to which the other of the clock signal and the inverted clock signal is input.

In the stage 10 illustrated in FIG. 4, when the switches SW1 and SW2 are turned on by the clock signal (or the inverted clock signal), the switches SW3 and SW4 are turned off by the inverted clock signal (or the clock signal), whereas when the switches SW1 and SW2 are turned off by the clock signal (or the inverted clock signal), the switches SW3 and SW4 are turned on by the inverted clock signal (or the clock signal). Accordingly, the stage 10 has a function of holding a signal input to the input terminal N in synchronization with the clock signal. The stage 10 illustrated in FIG. 4 can therefore be called a flip-flop circuit or a latch circuit.

One embodiment of a specific configuration of the amplifier circuits BUF1 and BUF2 will be described with reference to FIG. 5.

Figure 5:
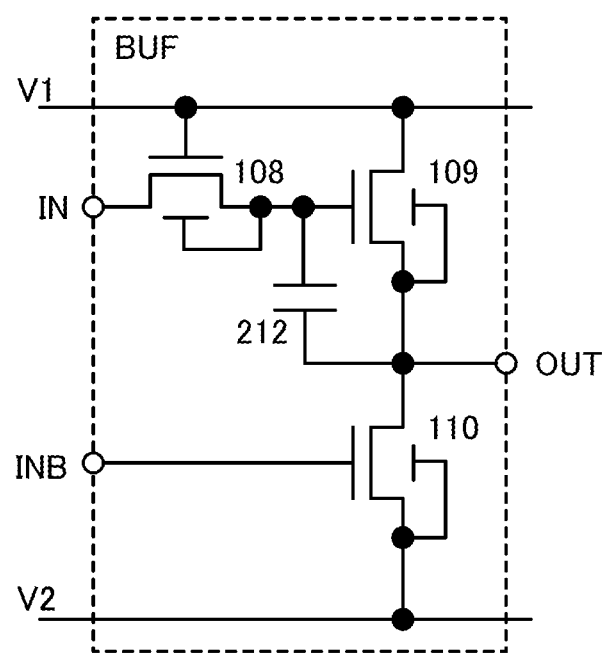
FIG. 5 illustrates a configuration of an amplifier circuit.

The amplifier circuits BUF1 and BUF2 each can be an amplifier circuit BUF illustrated in FIG. 5. The amplifier circuit BUF illustrated in FIG. 5 includes a transistor 108, a transistor 109, a transistor 110, and a capacitor 212. A gate of the transistor 108 is connected to a power supply line V1 to which a power supply potential V1 is supplied. A drain of the transistor 108 is connected to the input terminal N. A source of the transistor 108 is connected to a gate of the transistor 109. A drain of the transistor 109 is connected to the power supply line V1. A source of the transistor 109 is connected to the output terminal OUT. A gate of the transistor 110 is connected to the inverted input terminal NB. A source of the transistor 110 is connected to a power supply line V2 to which a power supply potential V2 different from the power supply potential V1 is supplied. A drain of the transistor 110 is connected to the output terminal OUT. One of a pair of electrodes of the capacitor 212 is connected to the gate of the transistor 109, and the other thereof is connected to the source of the transistor 109. Note that parasitic capacitance of the transistor 109 and the like can be actively used instead of providing the capacitor 212.

The transistors 108 to 110 can be of the same conductivity type. When the transistors 108 to 110 are n-channel transistors, the power supply potential V1 is set to be higher than the power supply potential V2 and the power supply potential V2 is, for example, a ground potential. That is, the power supply potential V1 is a high power supply potential and the power supply potential V2 is a low power supply potential. On the other hand, when the transistors 108 to 110 are p-channel transistors, the power supply potential V1 is set to be lower than the power supply potential V2 and is a ground potential, for example. That is, the power supply potential V1 is a low power supply potential and the power supply potential V2 is a high power supply potential.

Each of the transistors 108 to 110 includes a semiconductor layer in which a channel is formed and a pair of gate electrodes between which the semiconductor layer is sandwiched. One of the pair of gate electrodes can overlap with the semiconductor layer with a first gate insulating layer placed therebetween, and the other thereof can overlap with the semiconductor layer with a second gate insulating layer placed therebetween. Here, one of the pair of gate electrodes is called a gate of the transistor and the other thereof is called a backgate of the transistor. The other of the pair of gate electrodes (backgate) of the transistor can be connected to the source thereof. FIG. 5 schematically illustrates a configuration in which each of the transistors 108 to 110 has the gate and the backgate that is connected to the source. Note that the other of the pair of gate electrodes (backgate) can be connected to the power supply line V2. That is, the other of the pair of gate electrodes (backgate) can be connected to the low power supply line when the transistor is an n-channel transistor, whereas the other of the pair of gate electrodes (backgate) can be connected to the high power supply line when the transistor is a p-channel transistor. Thus, the transistors 108 to 110 can be prevented from being placed in a normally-on state.

It is possible that one of the pair of gate electrodes serves as the gate and the other thereof serves as the backgate in one or more of the transistors 108 to 110, and that one of the pair of gate electrodes serves as the backgate and the other thereof serves as the gate in the rest of them. For example, it is possible that one of the pair of gate electrodes serves as the gate and the other thereof serves as the backgate in the transistor 109, and that one of the pair of gate electrodes serves as the backgate and the other thereof serves as the gate in the transistor 110. That is, the positional relation between the gate and the backgate of the transistor 109 can be opposite to that of the transistor 110. For example, one of the transistors 109 and 110 can be a bottom-gate transistor in which the gate is provided below the semiconductor layer, and the other of the transistors 109 and 110 can be a top-gate transistor in which the gate is provided above the semiconductor layer. The backgate of the transistor can be electrically connected to the source thereof. Alternatively, the backgate can be electrically connected to the low power supply line when the transistor is an n-channel transistor, and electrically connected to the high power supply line when the transistor is a p-channel transistor.

The operation of the amplifier circuit BUF illustrated in FIG. 5 will be described.

First, the operation of the amplifier circuit BUF will be described assuming that the transistors 108 to 110 are n-channel transistors. When a low-level potential is input to the input terminal IN and a high-level potential is input to the inverted input terminal NB, the transistor 110 is turned on and the transistor 109 is turned off. Thus, the output terminal OUT is connected to the power supply line V2 and the power supply potential V2 (low power supply potential) is output from the output terminal OUT. When a high-level potential is input to the input terminal N and a low-level potential is input to the inverted input terminal NB, the transistor 110 is turned off and the transistor 109 is turned on. Thus, the output terminal OUT is connected to the power supply line V1. Here, when the potential of the source of the transistor 108 reaches a certain potential (a potential that is lower than the power supply potential V1, which is the potential of the gate of the transistor 108, by the threshold voltage of the transistor 108) by the high-level potential input to the input terminal N, the transistor 108 is turned off and the source of the transistor 108 is brought into a floating state. The potential of the source of the transistor 109 keeps rising, so that the potential of the gate of the transistor 109 is raised by capacitive coupling due to the capacitor 212. Accordingly, the potential of the output terminal OUT is raised to the power supply potential V1 (or a potential close thereto), and the power supply potential V1

(high power supply potential) is output from the output terminal OUT. In other words, it can be said that the amplifier circuit BUF illustrated in FIG. 5 includes a bootstrap circuit.

Next, the operation of the amplifier circuit BUF will be described assuming that the transistors 108 to 110 are p-channel transistors. When a high-level potential is input to the input terminal N and a low-level potential is input to the inverted input terminal NB, the transistor 110 is turned on and the transistor 109 is turned off. Thus, the output terminal OUT is connected to the power supply line V2 and the power supply potential V2 (high power supply potential) is output from the output terminal OUT. When a low-level potential is input to the input terminal N and a high-level potential is input to the inverted input terminal NB, the transistor 110 is turned off and the transistor 109 is turned on. Thus, the output terminal OUT is connected to the power supply line V1. Here, when the potential of the source of the transistor 108 reaches a certain potential (a potential that is higher than the power supply potential V1, which is the potential of the gate of the transistor 108, by the threshold voltage of the transistor 108) by the low-level potential input to the input terminal N, the transistor 108 is turned off and the source of the transistor 108 is brought into a floating state. The potential of the source of the transistor 109 keeps decreasing, so that the potential of the gate of the transistor 109 is lowered by capacitive coupling due to the capacitor 212. Accordingly, the potential of the output terminal OUT is lowered to the power supply potential V1 (or a potential close thereto), and the power supply potential V1 (low power supply potential) is output from the output terminal OUT. In other words, it can be said that the amplifier circuit BUF in FIG. 5 includes a bootstrap circuit.

The amplifier circuit BUF operates in the above manner and thus can be called a buffer circuit or a level shifter circuit.

Note that each of the logic circuits INV1 to INV4 illustrated in FIG. 4 can have the same configuration as the logic circuit NV illustrated in FIG. 2B in Embodiment 1. As has been described in Embodiment 1, the logic circuit NV in FIG. 2B can have a simpler configuration than the logic circuit NV in FIG. 2A, but cannot output an output signal with a predetermined amplitude, which is equal to the power supply voltage (corresponding to a difference between the high power supply potential and the low power supply potential, that is, $|V1-V2|$).

However, in FIG. 4, the outputs from the logic circuits INV3 and INV4 are input through the switches SW3 and SW4 to the logic circuits INV1 and INV2. The outputs from the logic circuits INV1 and INV2 are amplified by the amplifier circuits BUF1 and BUF2, and the amplified signals are to be the output signals from the output terminal OUT and the inverted output terminal OUTB of each stage 10. For that reason, even if the logic circuits INV1 to INV4 cannot output an output signal with an amplitude that is (substantially) equal to the power supply voltage (corresponding to a difference between the high power supply potential and the low power supply potential, that is, $|V1-V2|$), output signals with an amplitude that is (substantially) equal to the power supply voltage are output from the output terminal OUT and the inverted output terminal OUTB of the stage 10. Consequently, a semiconductor device that can output a signal with a predetermined amplitude can be provided.

Alternatively, any or all of the logic circuits INV1 to INV4 in FIG. 4 can have the same configuration as the logic circuit NV illustrated in FIG. 2A in Embodiment 1.

Each of the switches SW1 and SW2 can have the same configuration as that illustrated in FIG. 2C in Embodiment 1, and the description is therefore not repeated. The switches SW3 and SW4 can have the same configuration as that illustrated in FIG. 2D in Embodiment 1; therefore the description is not repeated.

Here, the requisite current drive capability of the switch is lower than that of the logic circuit and the amplifier circuit, so that the size of the transistor composed of the switch can be made smaller than that of the transistors included in the logic circuit and the amplifier circuit. That is, the channel width (W) (or the ratio (W/L) of channel width to channel length (L)) of the transistors 106 and 107 can be designed to be smaller than that of any or all of the transistors 104, 105, 108, 109, and 110. Thus, the increase in integration and reduction in size of the semiconductor device can be achieved.

Since the logic circuits INV1 to INV4 do not directly drive a load connected to the output terminal OUT, their requisite current drive capability is lower than that of the amplifier circuits BUF1 and BUF2. Therefore, the channel width (W) (or the ratio (W/L) of channel width to channel length (L)) of the transistors included in the logic circuits INV1 to INV4 (the transistors 104 and 105) can be smaller than that of the transistors included in the amplifier circuits BUF1 and BUF2 (the transistors 108 to 110, in particular the transistors 109 and 110). Thus, the increase in integration and reduction in size of the semiconductor device can be achieved.

The stage 10 illustrated in FIG. 4 has a configuration in which the logic circuit INV1, the amplifier circuit BUF1, the logic circuit INV2, and the amplifier circuit BUF2 are provided instead of the logic circuits INV1 and INV2 in the stage 10 in FIG. 1. In other words, the stage 10 in FIG. 4 has a configuration in which each of the logic circuits INV1 and INV2 in the stage 10 in FIG. 1 is divided into a circuit having a logic level inversion function and a circuit having an amplification function. Separation of the circuit having a logic level inversion function and the circuit having an amplification function enables transistors constituting the circuit having a logic level inversion function (the logic circuits INV1 and INV2 in FIG. 4) to be smaller in size than transistors constituting the circuit having an amplification function (the amplifier circuits BUF1 and BUF2 in FIG. 4) as described above. Consequently, the current drive capability of circuits (e.g., the switches SW1 to SW4 in FIG. 4) which input signals to the circuits having a logic level inversion function (the logic circuits INV1 and INV2 in FIG. 4) can be low. Thus, the increase in integration and reduction in size of the semiconductor device can be achieved.

Since the transistor 108 in the amplifier circuit BUF illustrated in FIG. 5 does not directly drive a load connected to the output terminal OUT, its requisite current drive capability is lower than that of the transistors 109 and 110. For that reason, the channel width (W) (or the ratio (W/L) of channel width to channel length (L)) of the transistor 108 can be made smaller than that of the transistors 109 and 110.

The semiconductor device according to one embodiment of the present invention can include a plurality of stages 10 illustrated in FIG. 4. For example, as illustrated in FIG. 3, the semiconductor device 100 can include a plurality of stages 10 that are cascaded so that the input terminal N is connected to the output terminal OUT of the previous stage and the inverted input terminal NB is connected to the inverted output terminal OUTB of the previous stage. Here, in adjacent two stages among the plurality of stages 10, the logic levels of signals input to the terminals C1 can be different from each other (i.e., the logic levels of signals input to the terminals C2 can be different from each other). For example, the clock signal can be input to the terminal C1 and the inverted clock signal can be input to the terminal C2 in one stage 10, and the inverted clock signal can be input to the terminal C1 and the clock signal can be input to the terminal C2 in the stage 10 next to the one stage 10. In FIG. 3, the clock signal is represented by CLK, and the inversion signal of the clock signal is represented by CLKB. Signals input to the input terminal IN and the inverted input terminal NB of the first stage among the cascaded stages 10 can be signals with opposite logic levels. In FIG. 3, the signal SP and the inversion signal SPB of the signal SP are input to the input terminal N and the inverted input terminal INB, respectively, of the first stage.

The semiconductor device 100 illustrated in FIG. 3 has a function of holding a signal that is input to the input terminal IN of the first stage sequentially in the stages 10 in synchronization with the clock signal. The semiconductor device 100 can therefore be called a shift register. The signal SP can be called a start pulse. The semiconductor device 100 has a function of sequentially shifting the start pulse in synchronization with the clock signal CLK and outputting the shifted pulses as outputs SR1, SR2, SR3 . . . . The semiconductor device 100 can drive a load with the outputs SR1, SR2, SR3 . . . . Although the outputs SR1 to SR3 are set as output signals from the output terminal OUT of each stage 10 here, they are not limited to these and may be output signals from the inverted output terminal OUTB of each stage 10, for example. Alternatively, only outputs SR2, SR4, SR6 . . . of even-numbered stages 10 may be used as outputs of the semiconductor device 100 to drive a load.

The semiconductor device shown in this embodiment includes the switches (the switches SW1 to SW4), the logic circuits having an input terminal to which an input signal is input through the switch in the on state (the logic circuits INV1 to INV4), and the amplifier circuits (the amplifier circuits BUF1 and BUF2). The switch is turned on or off by a clock signal (or an inversion signal of the clock signal). The amplifier circuit outputs a signal having the same logic level as an input signal from the output terminal OUT by connecting the output terminal to the high power supply line or the low power supply line. The output from the amplifier circuit is to be the output from the semiconductor device. Accordingly, a load driven by the semiconductor device is driven while being connected to the high power supply line or the low power supply line. The semiconductor device having such a structure does not drive a load by using a high-level potential (or a low-level potential) of the clock signal, and thus a clock signal generator does not need high current drive capability. Consequently, the area of the clock signal generator can be reduced.

When all the transistors included in the semiconductor device have the same conductivity type, the process of fabricating the semiconductor device can be simplified. Thus, the yield can be increased and the costs can be reduced. In that case, the amplifier circuits (the amplifier circuits BUF1 and BUF2) are configured to correct the output signal by using a bootstrap circuit. In such a manner, the amplifier circuit constituted of transistors of the same conductivity type can output an output signal with an amplitude voltage that is (substantially) equal to the power supply voltage (corresponding to a difference between the high power supply potential and the low power supply potential).

Further, the logic circuit has a plurality of input terminals (an input terminal to which an input signal is input, and an inverted input terminal to which a signal with a logic level opposite to that of the input signal is input). The logic circuit can be configured to invert the logic level of an input signal input to the input terminal and output the inverted signal from the output terminal by controlling connection between the output terminal and one of the high power supply line and the low power supply line with a signal input to the inverted input terminal, and by controlling connection between the output terminal and the other of the high power supply line and the low power supply line with a signal input to the input terminal. Accordingly, in the logic circuit composed of transistors of the same conductivity type, one of the transistor provided between the high power supply line and the output terminal and the transistor provided between the low power supply line and the output terminal can be turned on, while the other of these two transistors can be turned off. As a result, the through current in a circuit provided between the high power supply line and the low power supply line can be suppressed.

The amplifier circuit has a plurality of input terminals (an input terminal to which an input signal is input, and an inverted input terminal to which a signal with a logic level opposite to that of the input signal is input). The amplifier circuit can be configured to output, from the output terminal, a signal having the same logic level as the input signal input to the input terminal by controlling connection between the output terminal and one of the high power supply line and the low power supply line with a signal input to the inverted input terminal, and by controlling connection between the output terminal and the other of the high power supply line and the low power supply line with a signal input to the input terminal. Accordingly, in the amplifier circuit composed of transistors of the same conductivity type, one of the transistor provided between the high power supply line and the output terminal and the transistor provided between the low power supply line and the output terminal can be turned on, while the other of these two transistors can be turned off. As a result, the through current in a circuit provided between the high power supply line and the low power supply line can be suppressed.

The transistors included in the semiconductor device each include a semiconductor layer in which a channel is formed and a pair of gate electrodes between which the semiconductor layer is sandwiched. One of the pair of gate electrodes can overlap with the semiconductor layer with the first gate insulating layer placed therebetween, and the other thereof can overlap with the semiconductor layer with the second gate insulating layer placed therebetween. The other of the pair of gate electrodes (backgate) of the transistor can be connected to the source thereof. Alternatively, the other of the pair of gate electrodes (backgate) can be connected to the low power supply line when the transistor is an n-channel transistor, and can be connected to the high power supply line when the transistor is a p-channel transistor.

Thus, the transistors can be prevented from being placed in a normally-on state, resulting in reduction in malfunction of the semiconductor device and reduction in through current.

This embodiment can be freely combined with any of the other embodiments.

(Embodiment 3)

In Embodiment 3, a specific embodiment of a semiconductor device according to the present invention will be described with reference to FIG. 6.

Figure 6:
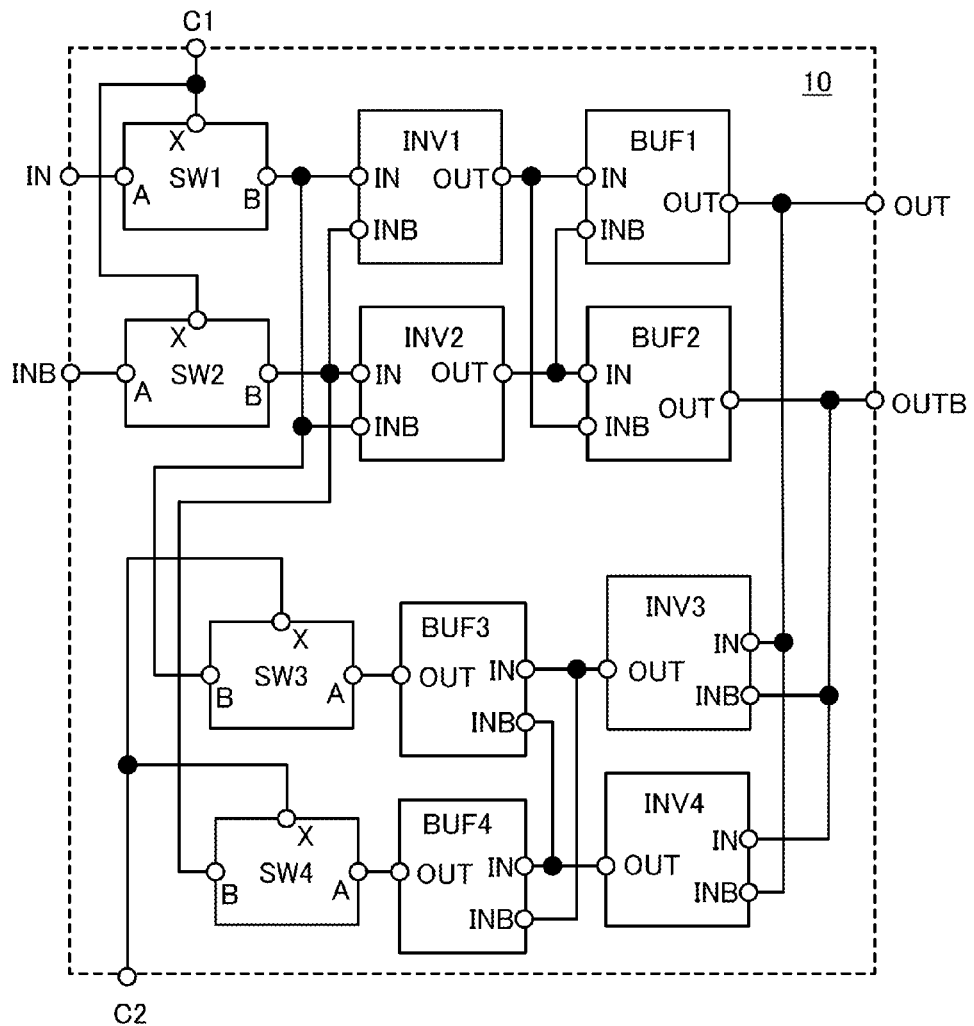
FIG. 6 illustrates a configuration of a semiconductor device described in Embodiment 3.
Figure 7:
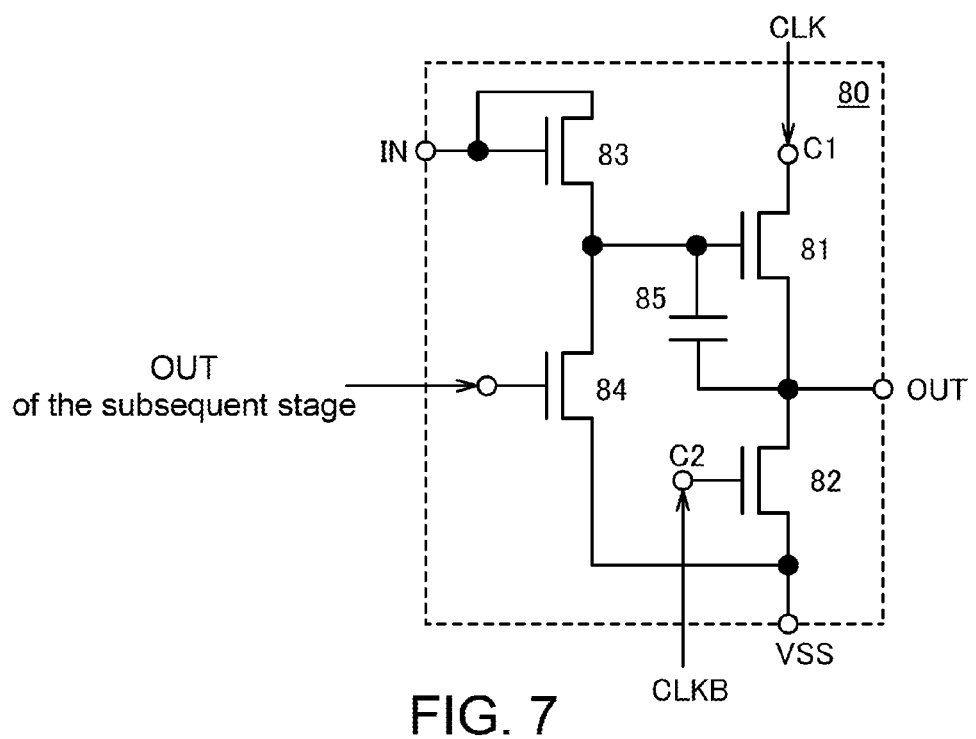
FIG. 7 illustrates a configuration of a conventional semiconductor device.

The semiconductor device can include a stage 10 illustrated in FIG. 6. The stage 10 includes an input terminal N, an inverted input terminal NB, a switch SW1, a switch SW2, a switch SW3, a switch SW4, a logic circuit INV1, a logic circuit INV2, a logic circuit INV3, a logic circuit INV4, an amplifier circuit BUF1, an amplifier circuit BUF2, an amplifier circuit BUF3, an amplifier circuit BUF4, an output terminal OUT, and an inverted output terminal OUTB.

Each of the logic circuits INV1 to INV4 has an input terminal N, an inverted input terminal NB, and an output terminal OUT and inverts a signal input to the input terminal N and outputs the inverted signal from the output terminal OUT. The logic circuits INV1 to INV4 can be called inverters.

Each of the amplifier circuits BUF1 to BUF4 has an input terminal N, an inverted input terminal NB, and an output terminal OUT and transforms (lowers) the impedance to output, from the output terminal OUT, a signal input to the input terminal N. The output terminal OUT of the logic circuit INV1 is connected to the input terminal N of the amplifier circuit BUF1 and the inverted input terminal NB of the amplifier circuit BUF2. The output terminal OUT of the logic circuit INV2 is connected to the inverted input terminal NB of the amplifier circuit BUF1 and the input terminal N of the amplifier circuit BUF2. The output terminal OUT of the amplifier circuit BUF1 is connected to the input terminal N of the logic circuit INV3, the inverted input terminal INB of the logic circuit INV4, and the output terminal OUT. The output terminal OUT of the amplifier circuit BUF2 is connected to the inverted input terminal NB of the logic circuit INV3, the input terminal N of the logic circuit INV4, and the inverted output terminal OUTB. The output terminal OUT of the logic circuit INV3 is connected to the input terminal N of the amplifier circuit BUF3 and the inverted input terminal NB of the amplifier circuit BUF4. The output terminal OUT of the logic circuit INV4 is connected to the inverted input terminal NB of the amplifier circuit BUF3 and the input terminal N of the amplifier circuit BUF4. The switches SW1 to SW4 each have a function of determining electrical continuity between a terminal A and a terminal B depending on a signal input to a terminal X. Thus, the switch SW1 has a function of determining electrical continuity between the input terminal N and the input terminal N of the logic circuit INV1 and between the input terminal N and the inverted input terminal NB of the logic circuit INV2 depending on a signal input to the terminal X. The switch SW2 has a function of determining electrical continuity between the inverted input terminal NB and the inverted input terminal NB of the logic circuit INV1 and between the inverted input terminal NB and the input terminal IN of the logic circuit INV2 depending on a signal input to the terminal X. The terminals X of the switches SW1 and SW2 are connected to a terminal C1 to which one of a clock signal and an inversion signal of the clock signal (inverted clock signal) is input. The switch SW3 has a function of determining electrical continuity between the output terminal OUT of the amplifier circuit BUF3 and the input terminal N of the logic circuit INV1 and between the output terminal OUT of the amplifier circuit BUF3 and the inverted input terminal NB of the logic circuit INV2 depending on a signal input to the terminal X. The switch SW4 has a function of determining electrical continuity between the output terminal OUT of the amplifier circuit BUF4 and the inverted input terminal NB of the logic circuit INV1 and between the output terminal OUT of the amplifier circuit BUF4 and the input terminal N of the logic circuit INV2 depending on a signal input to the terminal X. The terminals X of the switches SW3 and SW4 are connected to a terminal C2 to which the other of the clock signal and the inverted clock signal is input.

In the stage 10 illustrated in FIG. 6, when the switches SW1 and SW2 are turned on by the clock signal (or the inverted clock signal), the switches SW3 and SW4 are turned off by the inverted clock signal (or the clock signal), whereas when the switches SW1 and SW2 are turned off by the clock signal (or the inverted clock signal), the switches SW3 and SW4 are turned on by the inverted clock signal (or the clock signal). Accordingly, the stage 10 has a function of holding a signal input to the input terminal N in synchronization with the clock signal. The stage 10 illustrated in FIG. 6 can therefore be called a flip-flop circuit or a latch circuit.

Specifically, each of the amplifier circuits BUF1 to BUF4 can have the same configuration as the amplifier circuit BUF illustrated in FIG. 5 in Embodiment 2; therefore, the description is not repeated.

Note that each of the logic circuits INV1 to INV4 illustrated in FIG. 6 can have the same configuration as the logic circuit NV illustrated in FIG. 2B in Embodiment 1. As has been described in Embodiment 1, the logic circuit NV in FIG. 2B can have a simpler configuration than the logic circuit NV in FIG. 2A, but cannot output an output signal with a predetermined amplitude, which is equal to the power supply voltage (corresponding to a difference between the high power supply potential and the low power supply potential, that is, $|V1-V2|$).

However, in FIG. 6, the outputs from the logic circuits INV1 and INV2 are amplified by the amplifier circuits BUF1 and BUF2, and the amplified signals are to be the output signals from the output terminal OUT and the inverted output terminal OUTB of each stage. The outputs from the logic circuits INV3 and INV4 are amplified by the amplifier circuits BUF3 and BUF4. For that reason, even if the logic circuits INV1 to INV4 cannot output an output signal with an amplitude that is (substantially) equal to the power supply voltage (corresponding to a difference between the high power supply potential and the low power supply potential, that is, $|V1-V2|$), output signals with an amplitude that is (substantially) equal to the power supply voltage are output from the output terminal OUT and the inverted output terminal OUTB of the stage 10. Consequently, a semiconductor device that can output a signal with a predetermined amplitude can be provided.

In addition, in the configuration illustrated in FIG. 6, signals input to the logic circuits INV1 and INV2 through the switches SW3 and SW4 are signals with an amplitude that is (substantially) equal to the power supply voltage (corresponding to a difference between the high power supply potential and the low power supply potential, that is, $|V1-V2|$), which are amplified by the amplifier circuits BUF3 and BUF4. For that reason, a malfunction of the logic circuits INV1 and INV2 can be reduced even if the threshold voltage of the transistors included in these logic circuits changes somewhat due to deterioration over time or the like.

Alternatively, any or all of the logic circuits INV1 to INV4 in FIG. 6 can have the same configuration as the logic circuit NV illustrated in FIG. 2A in Embodiment 1.

Each of the switches SW1 and SW2 can have the same configuration as that illustrated in FIG. 2C in Embodiment 1, and the description is therefore not repeated. The switches SW3 and SW4 can have the same configuration as that illustrated in FIG. 2D in Embodiment 1; therefore the description is not repeated.

Here, the requisite current drive capability of the switch is lower than that of the logic circuit and the amplifier circuit, so that the size of the transistor composed of the switch can be made smaller than that of the transistors included in the logic circuit and the amplifier circuit. That is, the channel width (W) (or the ratio (W/L) of channel width to channel length (L)) of the transistors 106 and 107 can be designed to be smaller than that of any or all of the transistors 104, 105, and 108 to 110. Thus, the increase in integration and reduction in size of the semiconductor device can be achieved.

Since the logic circuits INV1 to INV4 do not directly drive a load connected to the output terminal OUT, their requisite current drive capability is lower than that of the amplifier circuits BUF1 and BUF2. Therefore, the channel width (W) (or the ratio (W/L) of channel width to channel length (L)) of the transistors included in the logic circuits INV1 to INV4

(the transistors 104 and 105) can be smaller than that of the transistors included in the amplifier circuits BUF1 and BUF2 (the transistors 108 to 110, in particular the transistors 109 and 110). Thus, the increase in integration and reduction in size of the semiconductor device can be achieved.

Since the transistor 108 in the amplifier circuit BUF illustrated in FIG. 5 does not directly drive a load connected to the output terminal OUT, its requisite current drive capability is lower than that of the transistors 109 and 110. For that reason, the channel width (W) (or the ratio (W/L) of channel width to channel length (L)) of the transistor 108 can be made smaller than that of the transistors 109 and 110.

Since the amplifier circuits BUF3 and BUF4 do not directly drive a load connected to the output terminal OUT, their requisite current drive capability is lower than that of the amplifier circuits BUF1 and BUF2. Therefore, the channel width (W) (or the ratio (W/L) of channel width to channel length (L)) of the transistors included in the amplifier circuits BUF3 and BUF4 (the transistors 108 to 110, in particular the transistors 109 and 110) can be smaller than that of the transistors included in the amplifier circuits BUF1 and BUF2 (the transistors 108 to 110, in particular the transistors 109 and 110). Thus, the increase in integration and reduction in size of the semiconductor device can be achieved.

The semiconductor device according to one embodiment of the present invention can include a plurality of stages 10 illustrated in FIG. 6. For example, as illustrated in FIG. 3, the semiconductor device 100 can include a plurality of stages 10 that are cascaded so that the input terminal N is connected to the output terminal OUT of the previous stage and the inverted input terminal NB is connected to the inverted output terminal OUTB of the previous stage. Here, in adjacent two stages among the plurality of stages 10, the logic levels of signals input to the terminals C1 can be different from each other (i.e., the logic levels of signals input to the terminals C2 can be different from each other). For example, the clock signal can be input to the terminal C1 and the inverted clock signal can be input to the terminal C2 in one stage 10, and the inverted clock signal can be input to the terminal C1 and the clock signal can be input to the terminal C2 in the stage 10 next to the one stage 10. In FIG. 3, the clock signal is represented by CLK, and the inversion signal of the clock signal is represented by CLKB. Signals input to the input terminal IN and the inverted input terminal NB of the first stage among the cascaded stages 10 can be signals with opposite logic levels. In FIG. 3, the signal SP and the inversion signal SPB of the signal SP are input to the input terminal N and the inverted input terminal INB, respectively, of the first stage.

The semiconductor device 100 illustrated in FIG. 3 has a function of holding a signal that is input to the input terminal N of the first stage sequentially in the stages 10 in synchronization with the clock signal. The semiconductor device 100 can therefore be called a shift register. The signal SP can be called a start pulse. The semiconductor device 100 has a function of sequentially shifting the start pulse in synchronization with the clock signal CLK and outputting the shifted pulses as outputs SR1, SR2, SR3 .... The semiconductor device 100 can drive a load with the outputs SR1, SR2, SR3 .... Although the outputs SR1 to SR3 are set as output signals from the output terminal OUT of each stage 10 here, they are not limited to these and may be output signals from the inverted output terminal OUTB of each stage 10, for example. Alternatively, only outputs SR2, SR4, SR6 ... of even-numbered stages 10 may be used as outputs of the semiconductor device 100 to drive a load.

The semiconductor device shown in this embodiment includes the switches (the switches SW1 to SW4), the logic circuits having an input terminal to which an input signal is input through the switch in the on state (the logic circuits INV1 to INV4), and the amplifier circuits (the amplifier circuits BUF1 to BUF4). The switch is turned on or off by a clock signal (or an inversion signal of the clock signal). The amplifier circuit outputs a signal having the same logic level as an input signal from the output terminal OUT by connecting the output terminal to the high power supply line or the low power supply line. The output from the amplifier circuit is to be the output from the semiconductor device. Accordingly, a load driven by the semiconductor device is driven while being connected to the high power supply line or the low power supply line. The semiconductor device having such a structure does not drive a load by using a high-level potential (or a low-level potential) of the clock signal, and thus a clock signal generator does not need high current drive capability. Consequently, the area of the clock signal generator can be reduced.

When all the transistors included in the semiconductor device have the same conductivity type, the process of fabricating the semiconductor device can be simplified. Thus, the yield can be increased and the costs can be reduced. In that case, the amplifier circuits (the amplifier circuits BUF1 to BUF4) are configured to correct the output signal by using a bootstrap circuit. In such a manner, the amplifier circuit constituted of transistors of the same conductivity type can output an output signal with an amplitude voltage that is (substantially) equal to the power supply voltage (corresponding to a difference between the high power supply potential and the low power supply potential).

Further, the logic circuit has a plurality of input terminals (an input terminal to which an input signal is input, and an inverted input terminal to which a signal with a logic level opposite to that of the input signal is input). The logic circuit can be configured to invert the logic level of an input signal input to the input terminal and output the inverted signal from the output terminal by controlling connection between the output terminal and one of the high power supply line and the low power supply line with a signal input to the inverted input terminal, and by controlling connection between the output terminal and the other of the high power supply line and the low power supply line with a signal input to the input terminal. Accordingly, in the logic circuit composed of transistors of the same conductivity type, one of the transistor provided between the high power supply line and the output terminal and the transistor provided between the low power supply line and the output terminal can be turned on, while the other of these two transistors can be turned off. As a result, the through current in a circuit provided between the high power supply line and the low power supply line can be suppressed.

The amplifier circuit has a plurality of input terminals (an input terminal to which an input signal is input, and an inverted input terminal to which a signal with a logic level opposite to that of the input signal is input). The amplifier circuit can be configured to output, from the output terminal, a signal having the same logic level as the input signal input to the input terminal by controlling connection between the output terminal and one of the high power supply line and the low power supply line with a signal input to the inverted input terminal, and by controlling connection between the output terminal and the other of the high power supply line and the low power supply line with a signal input to the input terminal. Accordingly, in the amplifier circuit composed of transistors of the same conductivity type, one of the transistor provided between the high power supply line and the output terminal and the transistor provided between the low power supply line and the output terminal can be turned on, while the other of these two transistors can be turned off. As a result, the through current in a circuit provided between the high power supply line and the low power supply line can be suppressed.

The transistors included in the semiconductor device each include a semiconductor layer in which a channel is formed and a pair of gate electrodes between which the semiconductor layer is sandwiched. One of the pair of gate electrodes can overlap with the semiconductor layer with the first gate insulating layer placed therebetween, and the other thereof can overlap with the semiconductor layer with the second gate insulating layer placed therebetween. The other of the pair of gate electrodes (backgate) of the transistor can be connected to the source thereof. Alternatively, the other of the pair of gate electrodes (backgate) can be connected to the low power supply line when the transistor is an n-channel transistor, and can be connected to the high power supply line when the transistor is a p-channel transistor. Thus, the transistors can be prevented from being placed in a normally-on state, resulting in reduction in malfunction of the semiconductor device and reduction in through current.

This embodiment can be freely combined with any of the other embodiments.

(Embodiment 4)

In Embodiment 4, an embodiment of the structure of a transistor included in the semiconductor device shown in Embodiments 1 to 3 (e.g., the transistors 101 to 110) will be described with reference to FIGS. 8A and 8B and FIGS. 9A to 9E.

Figure 8A:
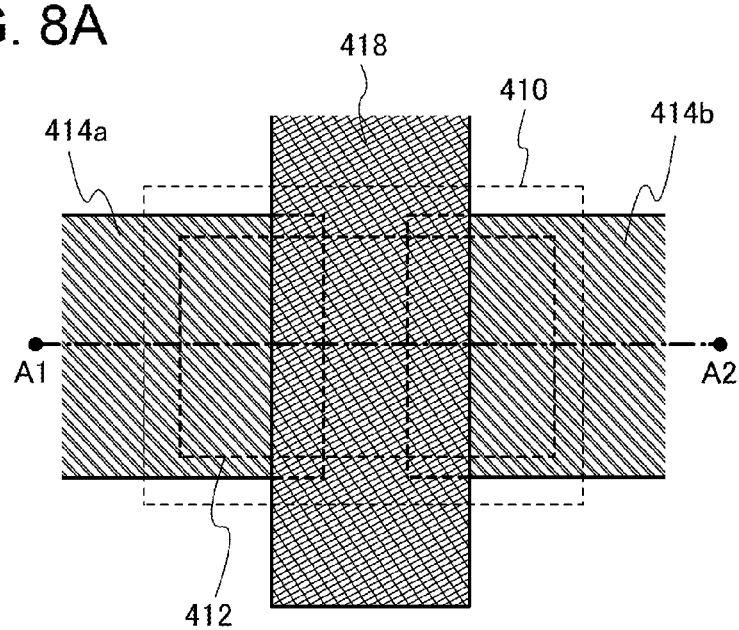
FIGS. 8A and 8B illustrate an example of a structure of a transistor.
Figure 8B:
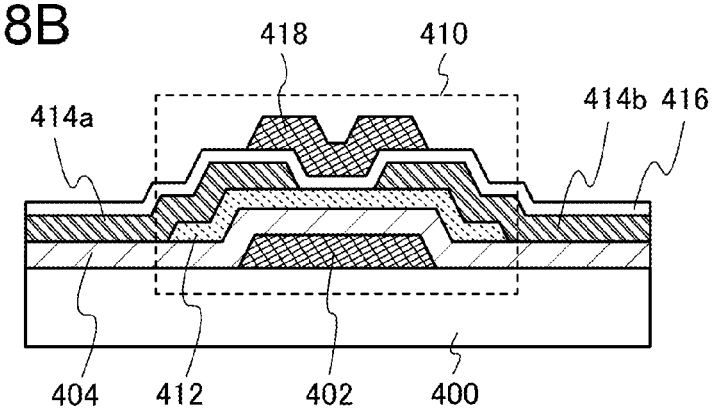

FIG. 8A is a top view of a transistor. FIG. 8B is an example of a cross-sectional view along A1-A2 in FIG. 8A. The transistor in FIGS. 8A and 8B includes a layer containing an oxide semiconductor (hereinafter referred to as "oxide semiconductor layer") as a semiconductor layer in which a channel is formed. Advantages of using an oxide semiconductor layer are that high mobility and low off-state current can be achieved by a simple low-temperature process.

As illustrated in FIG. 8B, a transistor 410 includes a gate electrode 402, a gate insulating layer 404, an oxide semiconductor layer 412, a drain electrode 414a, and a source electrode 414b over a substrate 400 having an insulating surface. Moreover, a gate insulating layer 416 in contact with the oxide semiconductor layer 412 is provided, and a gate electrode 418 is provided over the gate insulating layer 416. Note that one of the gate electrodes 402 and 418 corresponds to the gate in Embodiments 1 to 3, and the other of the gate electrodes 402 and 418 corresponds to the backgate in Embodiments 1 to 3. The source electrode 414b corresponds to the source in Embodiments 1 to 3, and the drain electrode 414a corresponds to the drain in Embodiments 1 to 3.

It is possible that one of the gate electrodes 402 and 418 serves as the gate and the other thereof serves as the backgate in one or more of a plurality of transistors included in the semiconductor device, and that one of the gate electrodes 402 and 418 serves as the backgate and the other thereof serves as the gate in the other transistors. That is, the positional relation between the gate and backgate of one or more of the transistors can be opposite to that of the other transistors included in the semiconductor device. For example, some of the transistors included in the semiconductor device can be bottom-gate transistors in which the gate electrode 402 provided below the oxide semiconductor layer 412 serves as a gate, and the other transistors included in the semiconductor device can be top-gate transistors in which the gate electrode 418 provided above the oxide semiconductor layer 412 serves as a gate. The backgate of the transistor (the gate electrode 402 or the gate electrode 418 depending on the structure of the transistor) can be electrically connected to the source thereof. Alternatively, the backgate can be electrically connected to a low power supply line when the transistor is an n-channel transistor, and electrically connected to a high power supply line when the transistor is a p-channel transistor.

In this embodiment, the oxide semiconductor layer 412 is used as the semiconductor layer. Since the off-state current of the transistor 410 including the oxide semiconductor layer 412 can be extremely low, the use of the transistor 410 in a shift register or the like facilitates retention of the potential of each node in the circuit, resulting in a very low probability of occurrence of malfunctions.

In the transistor 410, the other of the gate electrodes 402 and 418 (backgate) can be connected to the source electrode 414b. Note that the source electrode 414b may be connected to the low power supply line when the transistor 410 is an n-channel transistor. Thus, the transistor 410 can be prevented from being placed in a normally-on state. Alternatively, the gate electrode 402 and the gate electrode 418 may be connected to each other to be used as the gate of the transistor 410.

The transistor 410 illustrated in FIGS. 8A and 8B has a structure where the drain electrode 414a and the source electrode 414b partly overlap with the gate electrode 402, or alternatively may have a structure where the drain electrode 414a and the source electrode 414b do not overlap with the gate electrode 402.

There is no particular limitation on the crystallinity of the oxide semiconductor layer 412. For example, the oxide semiconductor layer 412 can be non-single-crystal and may be amorphous or polycrystalline. Alternatively, the oxide semiconductor layer 412 may have an amorphous structure including a crystalline portion.

An amorphous oxide semiconductor layer can have a flat surface with relative ease; therefore, by using an amorphous oxide semiconductor layer to fabricate a transistor, interface scattering can be reduced, and relatively high mobility can be obtained with relative ease.

In a crystalline oxide semiconductor layer, defects in the bulk can be further reduced. When the flatness of the surface of the crystalline oxide semiconductor layer 412 is increased, the crystalline oxide semiconductor layer 412 can have higher mobility than an amorphous oxide semiconductor layer. In order to increase the surface flatness, the oxide semiconductor is preferably formed on a flat surface. Specifically, the oxide semiconductor is preferably formed on a surface with an average surface roughness (Ra) of 1 nm or less, preferably 0.3 nm or less, further preferably 0.1 nm or less.

Note that Ra is obtained by three-dimension expansion of arithmetic mean surface roughness that is defined by JIS B 0601:2001 (ISO 4287:1997) so as to be applied to a curved surface. In addition, Ra is an average value of the absolute values of deviations from a reference surface to a specific surface and is defined by the following formula.

[Formula 1]

$$Ra = \frac{1}{S_0} \int_{y_1}^{y_2} \int_{x_1}^{x_2} |f(x, y) - Z_0| dx dy \quad (1)$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Further, Ra can be measured with an atomic force microscope (AFM).

The oxide semiconductor layer 412 can be a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, a grain boundary in the CAAC-OS film is not found with the TEM. Thus, a reduction in electron mobility due to the grain boundary is suppressed in the CAAC-OS film.

In each of the crystal parts included in the CAAC-OS film, the c-axis is aligned in a direction parallel to a normal vector of a surface where the CAAC-OS film is formed or a normal vector of a top surface of the CAAC-OS film, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 85° to 95°, and the term "parallel" includes a range from −5° to 5°.

In the CAAC-OS film, distribution of crystal parts is not necessarily uniform. For example, when crystal growth occurs from a top surface side of the oxide semiconductor film in the process of forming the CAAC-OS film, the proportion of crystal parts in the vicinity of the top surface of the oxide semiconductor film is sometimes higher than that in the vicinity of the surface where the oxide semiconductor film is formed. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of the surface where the CAAC-OS film is formed or a normal vector of the top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). Note that the direction of the c-axis of the crystal part is the direction parallel to a normal vector of the surface where the CAAC-OS film is formed or a normal vector of the top surface of the CAAC-OS film. The crystal part is formed by deposition or by performing treatment for crystallization such as heat treatment after deposition.

In a transistor including the CAAC-OS film, change in electric characteristics due to irradiation with visible light or ultraviolet light can be reduced; thus, the transistor has high reliability.

Note that part of oxygen included in the oxide semiconductor film may be substituted with nitrogen.

There are three methods for obtaining a CAAC-OS film. The first is a method in which an oxide semiconductor layer is deposited at temperatures ranging from 200° C. to 500° C. so that the c-axes of crystals are substantially perpendicular to the top surface. The second is a method in which a thin oxide semiconductor layer is deposited and then subjected to heat treatment at temperatures ranging from 200° C. to 700° C. so that the c-axes of crystals are substantially perpendicular to the top surface. The third is a method in which a thin oxide semiconductor layer is deposited as a first layer and then subjected to heat treatment at temperatures ranging from 200° C. to 700° C. and an oxide semiconductor layer is deposited thereover as a second layer so that the c-axes of crystals are substantially perpendicular to the top surface.

The oxide semiconductor layer 412 has a thickness of 1 nm to 30 nm (preferably 5 nm to 10 nm) and can be formed by sputtering, molecular beam epitaxy (MBE), CVD, pulsed laser deposition, atomic layer deposition (ALD), or the like as appropriate. Alternatively, the oxide semiconductor layer 412 may be formed using a sputtering apparatus that performs deposition with surfaces of a plurality of substrates set substantially perpendicular to a surface of a sputtering target.

The oxide semiconductor layer 412 used as the semiconductor layer in this embodiment is preferably purified by removal of hydrogen, which is an n-type impurity, from the oxide semiconductor so that impurities which are not main components of the oxide semiconductor are contained as little as possible.

Note that the purified oxide semiconductor layer has very few carriers, and its carrier density is less than $1\times10^{14}/cm^3$, preferably less than $1\times10^{12}/cm^3$, further preferably less than $1\times10^{11}/cm^3$. Such few carriers enable a current in an off state (off-state current) to be sufficiently low.

Specifically, in the transistor including the above-described oxide semiconductor layer, the off-state current density obtained by dividing the off-state current by the channel width of the transistor at room temperature (25° C.) can be 100 zA/μm ($1\times10^{-19}$ A/μm) or lower, or even 10 zA/μm ($1\times10^{-20}$ A/μm) or lower under conditions that the channel length L of the transistor is 10 μm and the source-drain voltage is 3 V.

The transistor 410 including the purified oxide semiconductor layer has little temperature dependence of on-state current, and its off-state current remains low even at high temperatures.

Next, a process of fabricating the transistor 410 illustrated in FIGS. 8A and 8B will be described with reference to FIGS. 9A to 9E.

First, a conductive film is formed over the substrate 400 having an insulating surface, and then the gate electrode 402 is formed in a photolithography process. Note that a resist mask used in the photolithography process may be formed by an inkjet method. Formation of the resist mask by an inkjet method needs no photomask; thus, fabrication costs can be reduced.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, the substrate 400 may be a single crystal semiconductor substrate or a polycrystalline semiconductor substrate of silicon, silicon carbide, or the like; a compound semiconductor substrate of silicon germanium or the like; an SOI substrate; or any of these substrates over which a semiconductor element is provided.

A semiconductor device may be fabricated using a flexible substrate as the substrate 400. In order to fabricate a flexible semiconductor device, the transistor 410 including the oxide semiconductor layer 412 may be directly formed over a flexible substrate. Alternatively, the transistor 410 including the oxide semiconductor layer 412 may be formed over a substrate, and then the transistor 410 may be separated and transferred to a flexible substrate. In order to separate the transistor from the substrate and transfer it to the flexible substrate, a separation layer may be provided between the substrate and the transistor 410 including the oxide semiconductor layer 412.

The gate electrode 402 can be formed using a metal material such as molybdenum, titanium, tantalum, tungsten, aluminum, copper, chromium, neodymium, or scandium or an alloy material containing any of these materials as its main component. Alternatively, a semiconductor film typified by a polycrystalline silicon film doped with an impurity element such as phosphorus, or a silicide film such as a nickel silicide film may be used as the gate electrode 402. The gate electrode 402 may have a single-layer structure or a layered structure.

The gate electrode 402 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the gate electrode 402 can have a layered structure of the above conductive material and the above metal material.

As one layer of the gate electrode 402 which is in contact with the gate insulating layer 404 formed later, a film of metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films have a work function of 5 eV or higher, preferably 5.5 eV or higher; thus, when any of these films is used as the gate electrode, the threshold voltage of the n-channel transistor can be positive. Accordingly, a normally-off switching element can be provided.

Next, the gate insulating layer 404 is formed over the gate electrode 402.

The gate insulating layer 404 has a thickness of 1 nm to 20 nm and can be formed by sputtering, MBE, CVD, pulsed laser deposition, ALD, or the like as appropriate. Alternatively, the gate insulating layer 404 may be formed using a sputtering apparatus that performs deposition with surfaces of a plurality of substrates set substantially perpendicular to a surface of a sputtering target.

The gate insulating layer 404 can be formed using a silicon oxide film, a gallium oxide film, an aluminum oxide film, a silicon nitride film, a silicon oxynitride film, an aluminum oxynitride film, or a silicon nitride oxide film. A portion of the gate insulating layer 404 which is in contact with an oxide semiconductor layer 406 formed later preferably contains oxygen. In particular, the gate insulating layer 404 preferably contains a large amount of oxygen which exceeds at least the stoichiometric ratio in the layer (the bulk). For example, when a silicon oxide film is used as the gate insulating layer 404, the composition formula is $SiO_{2+\alpha}$ ($\alpha>0$). In this embodiment, a silicon oxide film of $SiO_{2+\alpha}$ ($\alpha>0$) is used as the gate insulating layer 404. By using the silicon oxide film as the gate insulating layer 404, oxygen can be supplied to the oxide semiconductor layer 406 formed later. Further, the gate insulating layer 404 is preferably formed in consideration of the size of a transistor to be fabricated and the step coverage with the gate insulating layer 404.

Alternatively, the gate insulating layer 404 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. The gate insulating layer 404 may have a single-layer structure or a layered structure.

Figure 9A:
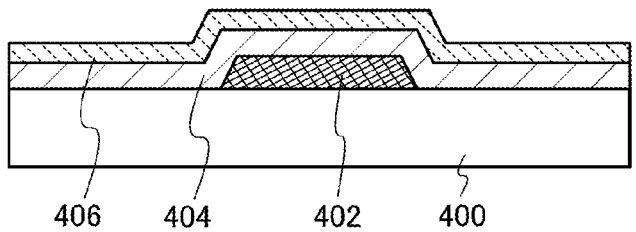
FIGS. 9A to 9E illustrate an example of a method for fabricating a transistor.
Figure 9B:
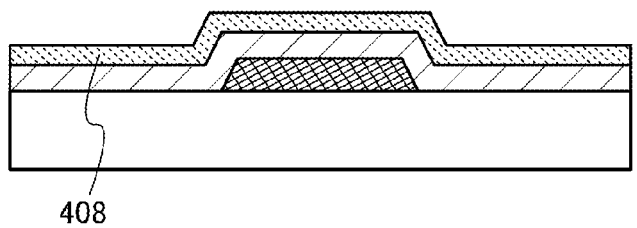

Then, the oxide semiconductor layer 406 is formed over the gate insulating layer 404 (see FIG. 9A).

In order to prevent the oxide semiconductor layer 406 from containing hydrogen or water as much as possible in the step of forming the oxide semiconductor layer 406, it is preferable to heat the substrate provided with the gate insulating layer 404 in a preheating chamber in a sputtering apparatus as a pretreatment for formation of the oxide semiconductor layer 406 so that impurities such as hydrogen and moisture adsorbed on the substrate 400 and the gate insulating layer 404 are eliminated and removed. Note that a cryopump is preferable as an exhaustion unit provided in the preheating chamber.

Planarization treatment may be performed on a region of the gate insulating layer 404 which is in contact with the oxide semiconductor layer 406. Although not particularly limited, the planarization treatment can be dry etching, plasma treatment, or polishing (e.g., chemical mechanical polishing (CMP)).

As plasma treatment, reverse sputtering in which an argon gas is introduced and plasma is generated can be performed, for example. The reverse sputtering is a method in which voltage is applied to the substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the gate insulating layer 404.

As the planarization treatment, dry etching, plasma treatment, or polishing may be performed plural times or these treatments may be performed in combination. In the case where the treatments are performed in combination, there is no particular limitation on the order of steps and the order can be set as appropriate depending on the roughness of the top surface of the gate insulating layer 404.

Note that the oxide semiconductor layer 406 is preferably deposited under conditions such that much oxygen is contained (e.g., deposited by sputtering in a 100% oxygen atmosphere) so as to be a film containing much oxygen (preferably having a region where the oxygen content is higher than that in the stoichiometric composition ratio of the oxide semiconductor in a crystalline state).

An oxide semiconductor used for the oxide semiconductor layer 406 preferably contains at least indium (In) or zinc (Zn). In particular, the oxide semiconductor preferably contains In and Zn. In addition, as a stabilizer for reducing variations in electric characteristics of transistors using the oxide semiconductor, the oxide semiconductor preferably contains gallium (Ga), tin (Sn), hafnium (Hf), and/or aluminum (Al).

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and/or lutetium (Lu).

As the oxide semiconductor, any of the following oxides can be used, for example: indium oxide, tin oxide, zinc oxide, two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Here, for example, an In—Ga—Zn-based oxide refers to an oxide containing In, Ga, and Zn, and there is no limitation on the composition ratio of In, Ga, and Zn. The In—Ga—Zn-based oxide may contain a metal element other than In, Ga, and Zn.

In this embodiment, as a target used for forming the oxide semiconductor layer 406 by sputtering, an oxide target having a composition ratio of In:Ga:Zn=3:1:2 (atomic ratio) is used to form an In—Ga—Zn-based oxide film (IGZO film).

The relative density of the target ranges from 90% to 100%, preferably from 95% to 99.9%. With the use of a target with high relative density, a dense oxide semiconductor layer 406 can be formed.

It is preferable to use a high-purity gas from which impurities such as hydrogen, water, a hydroxyl group, or hydride are removed as a sputtering gas used for forming the oxide semiconductor layer 406.

The substrate is held in a deposition chamber kept under reduced pressure. Then, a sputtering gas from which hydrogen and moisture have been removed is introduced into the deposition chamber while moisture remaining therein is removed, and the oxide semiconductor layer 406 is formed over the substrate 400 with the use of the above target. In order to remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber which is evacuated with a cryopump, a hydrogen atom, a compound containing a hydrogen atom such as water ($H_2O$), and the like (preferably, also a compound containing a carbon atom) are removed, whereby the impurity concentration in the oxide semiconductor layer 406 formed in the deposition chamber can be reduced.

The gate insulating layer 404 and the oxide semiconductor layer 406 are preferably formed in succession without being exposed to the air. When the gate insulating layer 404 and the oxide semiconductor layer 406 are formed in succession without being exposed to the air, impurities such as hydrogen and moisture can be prevented from being adsorbed onto a top surface of the gate insulating layer 404.

Next, heat treatment is performed to remove excess hydrogen (including water and a hydroxyl group) in the oxide semiconductor layer 406 (to dehydrate or dehydrogenate the oxide semiconductor layer 406). The heat treatment performed on the oxide semiconductor layer 406 can form an oxide semiconductor layer 408 from which excess hydrogen is removed (see FIG. 9B). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is a kind of heat treatment apparatus, and the oxide semiconductor layer 406 is subjected to the heat treatment at 450° C. for one hour in a nitrogen atmosphere.

Further, a heat treatment apparatus is not limited to an electric furnace, and a device for heating an object by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the heat treatment, GRTA may be performed as follows. The substrate is put in an inert gas heated at high temperatures of 650° C. to 700° C., heated for several minutes, and taken out of the inert gas.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (i.e., the impurity concentration is preferably 1 ppm or lower, further preferably 0.1 ppm or lower).

After the oxide semiconductor layer 406 is heated by the heat treatment, a high-purity oxygen gas, a high-purity dinitrogen monoxide gas, or ultra dry air (with a moisture amount of 20 ppm (−55° C. by conversion into a dew point) or less, preferably 1 ppm or less, further preferably 10 ppb or less in the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration of the oxygen gas or the dinitrogen monoxide gas is preferably 1 ppm or lower, further preferably 0.1 ppm or lower). The oxygen gas or the dinitrogen monoxide gas acts to supply oxygen which is a main component of the oxide semiconductor and is reduced by the step of removing impurities for the dehydration or dehydrogenation.

The heat treatment for dehydration or dehydrogenation may be performed plural times, and may also serve as another heat treatment.

It is preferable to perform the heat treatment for dehydration or dehydrogenation while the gate insulating layer 404 is covered with the film-shaped oxide semiconductor layer 406, which is not processed into an island shape to be the oxide semiconductor layer 412, because oxygen contained in the gate insulating layer 404 can be prevented from being released to the outside by the heat treatment.

Through the dehydration or dehydrogenation treatment, oxygen which is a main constituent of the oxide semiconductor might be eliminated and thus reduced in amount. An oxygen vacancy exists in a portion from which oxygen is eliminated in the oxide semiconductor layer 408, and causes a donor level leading to a change in electrical characteristics of a transistor.

Accordingly, oxygen is preferably supplied to the oxide semiconductor layer 408 after being subjected to the dehydration or dehydrogenation treatment. By supply of oxygen to the oxide semiconductor layer 408, oxygen vacancies in the layer can be filled.

For example, when an oxide insulating layer that contains much (excessive) oxygen and serves as an oxygen supply source is used as the gate insulating layer 404 and provided in contact with the oxide semiconductor layer 408, oxygen can be supplied from the oxide insulating layer to the oxide semiconductor layer 408. In the above structure, oxygen may be supplied to the oxide semiconductor layer 408 by performing heat treatment while the oxide insulating layer is in contact with at least part of the oxide semiconductor layer 408 subjected to the heat treatment for dehydration or dehydrogenation.

The gate insulating layer 404, which contains much (excessive) oxygen and serves as an oxygen supply source, is provided in contact with the oxide semiconductor layer 408, whereby oxygen can be supplied from the gate insulating layer 404 to the oxide semiconductor layer 408 and thus oxygen vacancies in the oxide semiconductor layer 408 can be filled.

Figure 9C:
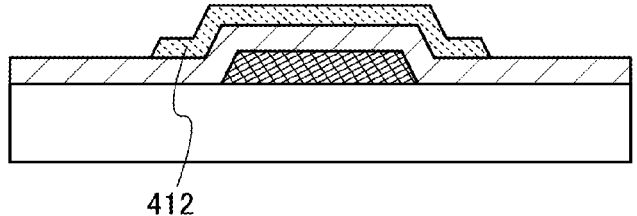

Next, the oxide semiconductor layer 408 is processed in a photolithography process, thereby forming the island-shaped oxide semiconductor layer 412 (see FIG. 9C). Note that a resist mask used in the photolithography process may be formed by an inkjet method. Formation of the resist mask by an inkjet method needs no photomask; thus, fabrication costs can be reduced.

Etching of the oxide semiconductor layer 408 may be wet etching, dry etching, or both wet etching and dry etching. As an etchant used for wet etching of the oxide semiconductor layer 408, a mixed solution of phosphoric acid, acetic acid, and nitric acid can be used, for example. Alternatively, ITO07N (produced by Kanto Chemical Co., Inc.) may be used.

Then, oxygen (including at least any one of oxygen radicals, oxygen atoms, and oxygen ions) may be introduced into the oxide semiconductor layer 412 in order to supply oxygen to the layer.

Supply of oxygen to the oxide semiconductor layer 412 by introduction of oxygen thereto can purify the oxide semiconductor layer 412. The transistor including the purified oxide semiconductor layer 412 is electrically stable because a change in electric characteristics is small.

Oxygen can be introduced by ion implantation, ion doping, plasma immersion ion implantation, plasma treatment, or the like.

In the step of introducing oxygen into the oxide semiconductor layer 412, oxygen may be directly introduced into the oxide semiconductor layer 412 or introduced into the oxide semiconductor layer 412 through the gate insulating layer 416 formed later. Ion implantation, ion doping, plasma immersion ion implantation, or the like can be used to introduce oxygen through the gate insulating layer 416, whereas plasma treatment or the like can also be used to introduce oxygen directly to the exposed oxide semiconductor layer 412.

Oxygen can be introduced into the oxide semiconductor layer anytime after dehydration or dehydrogenation treatment is performed thereon. Further, oxygen may be introduced plural times into the dehydrated or dehydrogenated oxide semiconductor layer.

Figure 9D:
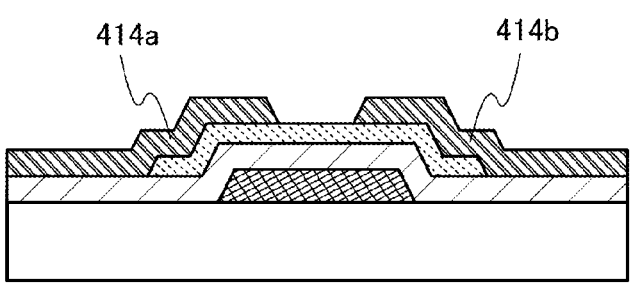

Next, a conductive film that is to be the drain electrode 414a and the source electrode 414b (as well as a wiring) is formed over the oxide semiconductor layer 412, and after that, a photolithography process is performed to form the drain electrode 414a and the source electrode 414b (see FIG. 9D).

The conductive film is formed using a material that can withstand heat treatment in a later step. The conductive film used for the drain electrode 414a and the source electrode 414b can be, for example, a metal film containing an element selected from Al, Cr, Cu, Ta, Ti, Mo, and W or a metal nitride film containing any of the above elements as its component (e.g., a titanium nitride film, a molybdenum nitride film, or a tungsten nitride film). Alternatively, the conductive film may have a structure in which a refractory metal film of Ti, Mo, W, or the like or a metal nitride film thereof (e.g., a titanium nitride film, a molybdenum nitride film, or a tungsten nitride film) is stacked over and/or below a metal film of Al, Cu, or the like. Further alternatively, the conductive film used for the drain electrode 414a and the source electrode 414b may be formed using conductive metal oxide. Examples of the conductive metal oxide are indium oxide ($In_2O_3$), tin oxide ($SnO_2$), zinc oxide (ZnO), indium oxide-tin oxide ($In_2O_3$—$SnO_2$: ITO), indium oxide-zinc oxide ($In_2O_3$—ZnO), and any of these metal oxide materials containing silicon or silicon oxide.

Next, the gate insulating layer 416 is formed so as to cover the oxide semiconductor layer 412, the drain electrode 414a, and the source electrode 414b. A material and a formation method of the gate insulating layer 416 can be similar to those of the gate insulating layer 404; therefore, the detailed description is not repeated.

Figure 9E:
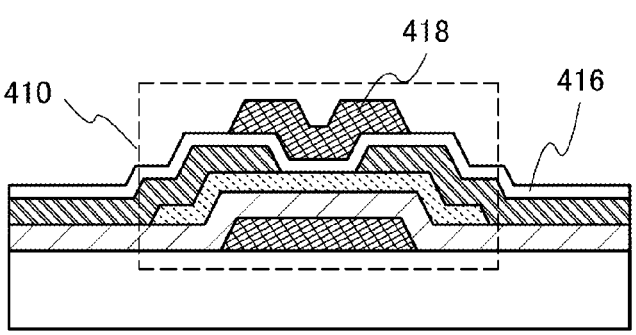

Then, a conductive film that is to be the gate electrode 418 is formed over the gate insulating layer 416, and after that, a photolithography process is performed to form the gate electrode 418 (see FIG. 9E). A material and a formation method of the gate electrode 418 can be similar to those of the gate electrode 402; therefore, the detailed description is not repeated.

Through the above steps, the transistor 410 is formed (see FIG. 9E).

A protective insulating layer may be formed over the gate insulating layer 416 and the gate electrode 418. The protective insulating layer prevents entry of hydrogen, water, and the like from the outside. As the protective insulating layer, a silicon nitride film or an aluminum nitride film can be used, for example. Although there is no particular limitation on the method of forming the protective insulating layer, RF sputtering is suitable because of its high productivity.

In addition, a planarization insulating film for reducing surface roughness due to the transistor may be formed over the protective insulating layer. For the planarization insulating film, an organic material such as polyimide, acrylic, or benzocyclobutene can be used. Other than such organic materials, it is also possible to use a low-dielectric constant material (low-k material) or the like. The planarization insulating film may be formed from a stack of a plurality of insulating films formed using these materials.

After the protective insulating layer or the planarization insulating film is formed, heat treatment may be performed at 100° C. to 200° C. for 1 hour to 30 hours in the air.

Since the transistor, which is fabricated as described above in accordance with this embodiment and whose channel is formed in the purified oxide semiconductor layer, has extremely low off-state current, the use of the transistor facilitates retention of the potential of a node. Consequently, when the transistor is used in a shift register or the like, the probability of occurrence of malfunctions can be extremely low.

This embodiment can be freely combined with any of the other embodiments.

EXAMPLE 1

A semiconductor device according to one embodiment of the present invention can be used in a variety of electronic devices. Examples of the electronic devices are personal computers (e.g., notebook computers and desktop computers), image reproducing devices provided with recording media (typically, devices that reproduce the content of recording media such as digital versatile discs (DVDs) and have displays for displaying the reproduced images), mobile phones, portable game consoles, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines.

An example of the electronic device will be described with reference to FIGS. 10A to 10C.

Figure 10A:
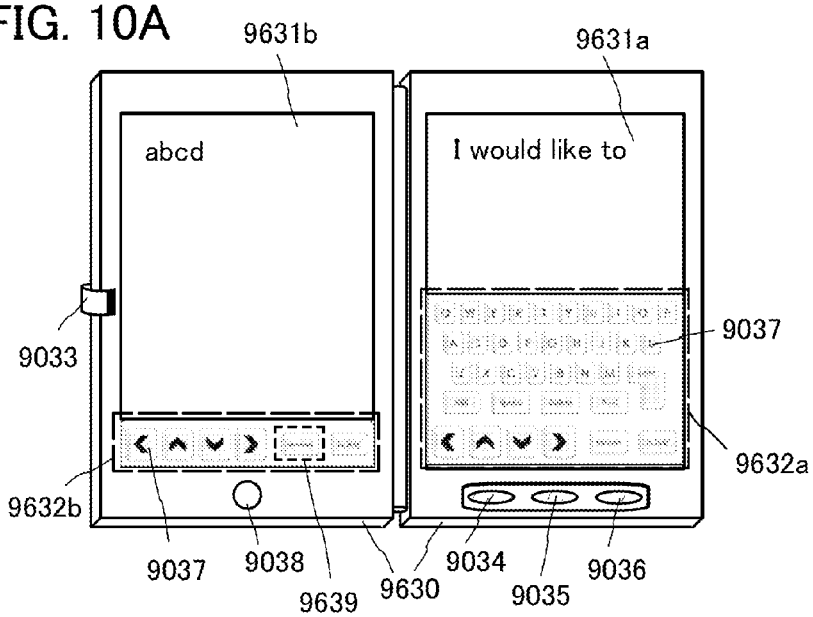
FIGS. 10A to 10C illustrate an electronic device.
Figure 10B:
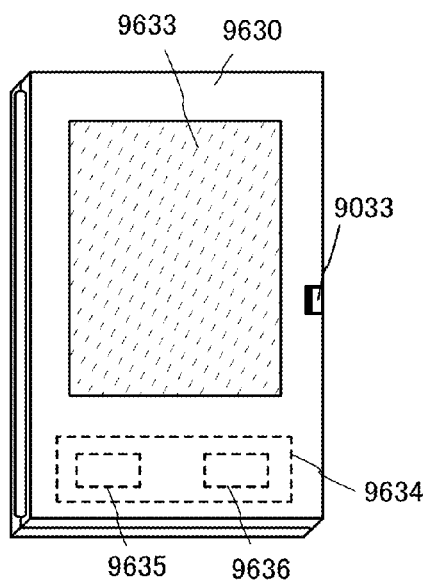
Figure 10C:
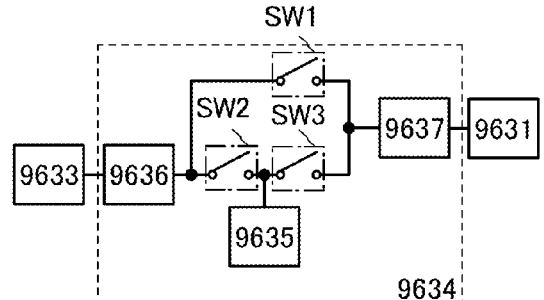

FIGS. 10A and 10B illustrate a tablet-type device (hereinafter referred to as "tablet") that can be folded in two. FIG. 10A illustrates the tablet which is open (unfolded). The tablet includes a housing 9630, a display portion 9631a, a display portion 9631b, a switch 9034 for switching display modes, a power switch 9035, a switch 9036 for switching to power-saving mode, a fastener 9033, and an operation switch 9038.

Part of the display portion 9631a can be a touch panel region 9632a, and data can be input by touching operation keys 9037 that are displayed. Note that FIG. 10A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although FIG. 10A shows the example where the display area of the display portion 9631a is the same as that of the display portion 9631b, there is no particular limitation on the display portions 9631a and 9631b. They may differ in size and/or image quality. For example, one of them may be a display panel that can display higher-definition images than the other.

FIG. 10B illustrates the tablet which is closed. The tablet includes the housing 9630, a solar battery 9633, a charge/discharge control circuit 9634, a battery 9635, and a DC to DC converter 9636. As an example, FIG. 10B illustrates the charge/discharge control circuit 9634 including the battery 9635 and the DC to DC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet illustrated in FIGS. 10A and 10B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

Power can be supplied to the display portion 9631 (the display portion 9631a and/or the display portion 9631b) and a touch panel, an image signal processor, and the like in the display portion 9631 by the solar battery 9633 attached on a surface of the tablet. The solar battery 9633 is preferably provided on at least one surface of the housing 9630 (e.g., all or part of the rear surface assuming that a surface where the display portions 9631a and 9631b are provided is the front surface), in which case the battery 9635 can be efficiently charged. The use of a lithium ion battery as the battery 9635 brings an advantage such as reduction in size.

The structure and operation of the charge/discharge control circuit 9634 illustrated in FIG. 10B will be described with reference to a block diagram in FIG. 10C. FIG. 10C illustrates the solar battery 9633, the battery 9635, the DC to DC converter 9636, a converter 9637, switches SW1 to SW3, and the display portion 9631. The battery 9635, the DC to DC converter 9636, the converter 9637, and the switches SW1 to SW3 correspond to the charge/discharge control circuit 9634 illustrated in FIG. 10B.

An example of the operation performed when power is generated by the solar battery 9633 using external light is described. The voltage of power generated by the solar battery 9633 is raised or lowered by the DC to DC converter 9636 so as to be a voltage for charging the battery 9635. Then, when power from the solar battery 9633 is used for the operation of the display portion 9631, the switch SW1 is turned on and the voltage of the power is raised or lowered by the converter 9637 so as to be a voltage needed for the display portion 9631. When images are not displayed on the display portion 9631, the switch SW1 is turned off and the switch SW2 is turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

This example can be combined with any of the above embodiments.

This application is based on Japanese Patent Applications serial No. 2011-182274 filed with Japan Patent Office on Aug. 24, 2011, the entire contents of which are hereby incorporated by reference.

What is claimed is:

1. A semiconductor device comprising:
a switch comprising a first transistor; and
a logic circuit comprising:
an input terminal to which an input signal is input through the switch;
an inverted input terminal to which a signal with a logic level opposite to that of the input signal is input; and
an output terminal from which an output signal is output,
wherein the logic circuit comprises a bootstrap circuit comprising at least one second transistor,
wherein the bootstrap circuit is electrically connected to the output terminal,
wherein the first transistor and the second transistor have the same conductivity type,
wherein each of the first transistor and the second transistor comprises an oxide semiconductor layer comprising a channel formation region and a pair of gate electrodes with the oxide semiconductor layer provided therebetween, and
wherein at least one of the first transistor and the second transistor comprises a source electrode being electrically connected to one of the pair of gate electrodes.

2. The semiconductor device according to claim 1,
wherein the logic circuit is supplied with a high power supply potential from a high power supply line,
wherein the logic circuit is supplied with a low power supply potential from a low power supply line, and
wherein one of the high power supply potential and the low power supply potential is output from the output terminal by correcting a potential of the output terminal with the bootstrap circuit.

3. An electronic device comprising the semiconductor device according to claim 1.

4. A semiconductor device comprising:
a switch comprising a first transistor; and
a logic circuit comprising:
an input terminal to which an input signal is input through the switch;
an inverted input terminal to which a signal with a logic level opposite to that of the input signal is input; and
an output terminal from which an output signal is output,
wherein the logic circuit comprises a bootstrap circuit comprising at least one second transistor,
wherein the bootstrap circuit is electrically connected to the output terminal,
wherein the first transistor and the second transistor have the same conductivity type,
wherein each of the first transistor and the second transistor comprises an oxide semiconductor layer comprising a channel formation region and a pair of gate electrodes with the oxide semiconductor layer provided therebetween,
wherein at least one of the first transistor and the second transistor comprises a source electrode being electrically connected to one of the pair of gate electrodes, and
wherein a width of one of the pair of gate electrodes of the first transistor is smaller than a width of one of the pair of gate electrodes of the second transistor.

5. The semiconductor device according to claim 4,
wherein the first transistor and the second transistor are n-channel transistors,
wherein the logic circuit is supplied with a high power supply potential from a high power supply line, and
wherein the high power supply potential is output from the output terminal by raising a potential of the output terminal with the bootstrap circuit.

6. The semiconductor device according to claim 4,
wherein the first transistor and the second transistor are p-channel transistors,
wherein the logic circuit is supplied with a low power supply potential from a low power supply line, and
wherein the low power supply potential is output from the output terminal by lowering a potential of the output terminal with the bootstrap circuit.

7. The semiconductor device according to claim 4,
wherein the first transistor and the second transistor are n-channel transistors,
wherein an electrical connection between a high power supply line and the output terminal is controlled by the signal with the logic level opposite to that of the input signal, and
wherein an electrical connection between a low power supply line and the output terminal is controlled by the input signal.

8. The semiconductor device according to claim 4,
wherein the first transistor and the second transistor are p-channel transistors,
wherein an electrical connection between a high power supply line and the output terminal is controlled by the input signal, and
wherein an electrical connection between a low power supply line and the output terminal is controlled by the signal with the logic level opposite to that of the input signal.

9. An electronic device comprising the semiconductor device according to claim 4.

10. A semiconductor device comprising:
a switch comprising a first transistor; and
a first logic circuit and a second logic circuit, each of the first logic circuit and the second logic circuit comprising:
an input terminal to which an input signal is input through the switch;
an inverted input terminal to which a signal with a logic level opposite to that of the input signal is input; and
an output terminal from which an output signal is output,
wherein the first logic circuit comprises a bootstrap circuit comprising at least one second transistor,
wherein the bootstrap circuit is electrically connected to the output terminal of the first logic circuit,
wherein the second logic circuit comprises an inverter circuit comprising at least one third transistor,
wherein the first transistor, the second transistor and the third transistor have the same conductivity type,
wherein each of the first transistor, the second transistor and the third transistor comprises an oxide semiconductor layer comprising a channel formation region and a pair of gate electrodes with the oxide semiconductor layer provided therebetween, and
wherein at least one of the first transistor, the second transistor, and the third transistor comprises a source electrode being electrically connected to one of the pair of gate electrodes.

11. The semiconductor device according to claim 10,
wherein the first transistor, the second transistor and the third transistor are n-channel transistors,
wherein the first logic circuit is supplied with a high power supply potential from a high power supply line, and wherein the high power supply potential is output from the output terminal of the first logic circuit by raising a potential of the output terminal with the bootstrap circuit.

12. The semiconductor device according to claim 10,
wherein the first transistor, the second transistor and the third transistor are p-channel transistors,
wherein the first logic circuit is supplied with a low power supply potential from a low power supply line, and
wherein the low power supply potential is output from the output terminal of the first logic circuit by lowering a potential of the output terminal with the bootstrap circuit.

13. The semiconductor device according to claim 10,
wherein the first transistor, the second transistor and the third transistor are n-channel transistors,
wherein an electrical connection between a high power supply line and the output terminal of the first logic circuit is controlled by the signal with the logic level opposite to that of the input signal, and
wherein an electrical connection between a low power supply line and the output terminal of the first logic circuit is controlled by the input signal.

14. The semiconductor device according to claim 10,
wherein the first transistor, the second transistor and the third transistor are p-channel transistors,
wherein an electrical connection between a high power supply line and the output terminal of the first logic circuit is controlled by the input signal, and
wherein an electrical connection between a low power supply line and the output terminal of the first logic circuit is controlled by the signal with the logic level opposite to that of the input signal.

15. An electronic device comprising the semiconductor device according to claim 10.

16. A semiconductor device comprising:
a switch comprising a first transistor; and
a logic circuit comprising:
    an input terminal to which an input signal is input through the switch;
    an inverted input terminal to which a signal with a logic level opposite to that of the input signal is input; and
    an output terminal from which an output signal is output,
wherein the logic circuit comprises a bootstrap circuit comprising at least one second transistor,
wherein the bootstrap circuit is electrically connected to the output terminal,
wherein the first transistor and the second transistor have the same conductivity type,
wherein each of the first transistor and the second transistor comprises a semiconductor layer comprising a channel formation region and a pair of gate electrodes with the semiconductor layer provided therebetween, and
wherein at least one of the first transistor and the second transistor comprises a source electrode being electrically connected to one of the pair of gate electrodes.

17. The semiconductor device according to claim 16,
wherein the logic circuit is supplied with a high power supply potential from a high power supply line,
wherein the logic circuit is supplied with a low power supply potential from a low power supply line, and
wherein one of the high power supply potential and the low power supply potential is output from the output terminal by correcting a potential of the output terminal with the bootstrap circuit.

18. An electronic device comprising the semiconductor device according to claim 16.

* * * * *